US010032875B2

(12) United States Patent
Yamada

(10) Patent No.: US 10,032,875 B2
(45) Date of Patent: Jul. 24, 2018

(54) SEMICONDUCTOR DEVICE AND METHOD FOR MANUFACTURING THE SEMICONDUCTOR DEVICE

(71) Applicant: FUJITSU LIMITED, Kawasaki-shi, Kanagawa (JP)

(72) Inventor: Atsushi Yamada, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/461,042

(22) Filed: Mar. 16, 2017

(65) Prior Publication Data

US 2017/0309712 A1 Oct. 26, 2017

(30) Foreign Application Priority Data

Apr. 21, 2016 (JP) ................... 2016-085263

(51) Int. Cl.
*H01L 29/15* (2006.01)
*H01L 29/36* (2006.01)
(Continued)

(52) U.S. Cl.
CPC .......... *H01L 29/36* (2013.01); *H01L 21/0254* (2013.01); *H01L 21/0262* (2013.01);
(Continued)

(58) Field of Classification Search
CPC ............... H01L 29/778; H01L 29/7783; H01L 29/7787; H01L 29/66462; H01L 29/36;
(Continued)

(56) References Cited

U.S. PATENT DOCUMENTS

2006/0163659 A1* 7/2006 Asano ................ H01L 27/0251
257/357
2008/0258243 A1* 10/2008 Kuroda ............ H01L 29/42376
257/410
(Continued)

FOREIGN PATENT DOCUMENTS

JP 2001-144285 A * 5/2001 .......... H01L 29/778
JP 2002-359256 12/2002
(Continued)

OTHER PUBLICATIONS

Kikkawa et al., "Highly Reliable 250 GW High Electron Mobility Transistor Power Amplifier", Japanese Journal of Applied Physics 44 (7A), pp. 4896-4901 (Jul. 2005).*
(Continued)

*Primary Examiner* — Jami M Valentine
(74) *Attorney, Agent, or Firm* — Fujitsu Patent Center

(57) ABSTRACT

A semiconductor device includes a substrate, a first semiconductor layer formed over the substrate, a second semiconductor layer formed over the first semiconductor layer, a third semiconductor layer formed over the second semiconductor layer, and a gate electrode, a source electrode, and a drain electrode that are formed over the third semiconductor layer. The first semiconductor layer includes a first nitride semiconductor. The second semiconductor includes a second nitride semiconductor. The third semiconductor layer includes a third nitride semiconductor. The concentration of oxygen included in the second semiconductor layer is less than $5.0 \times 10^{18}$ cm$^{-3}$. The concentration of oxygen included in the third semiconductor layer is greater than or equal to $5.0 \times 10^{18}$ cm$^{-3}$.

18 Claims, 22 Drawing Sheets

(51) Int. Cl.
*H01L 21/02* (2006.01)
*H01L 21/265* (2006.01)
*H01L 29/20* (2006.01)
*H01L 29/205* (2006.01)
*H01L 29/66* (2006.01)
*H01L 29/778* (2006.01)
*H02M 3/335* (2006.01)
*H03F 3/193* (2006.01)
*H03F 3/21* (2006.01)

(52) U.S. Cl.
CPC .... *H01L 21/26546* (2013.01); *H01L 29/2003* (2013.01); *H01L 29/205* (2013.01); *H01L 29/66462* (2013.01); *H01L 29/7787* (2013.01); *H02M 3/33576* (2013.01); *H03F 3/193* (2013.01); *H03F 3/21* (2013.01); *H03F 2200/451* (2013.01)

(58) Field of Classification Search
CPC .............. H01L 29/205; H01L 29/2003; H01L 21/0254
USPC ..... 257/9, 194, E21.407, E29.246, E29.248, 257/E29.403, 76
See application file for complete search history.

(56) References Cited

U.S. PATENT DOCUMENTS

| | | | | |
|---|---|---|---|---|
| 2009/0126623 | A1* | 5/2009 | Yamazaki | C30B 19/02 117/77 |
| 2011/0049570 | A1* | 3/2011 | Miyoshi | H01L 29/201 257/192 |
| 2012/0315742 | A1* | 12/2012 | Yui | H01L 21/02458 438/478 |
| 2013/0168734 | A1* | 7/2013 | Miyoshi | H01L 29/7787 257/190 |

FOREIGN PATENT DOCUMENTS

| | | |
|---|---|---|
| JP | 2011-228428 | 11/2011 |
| JP | 2014-090065 | 5/2014 |

OTHER PUBLICATIONS

Jan Kuzmik, "Power Electronics on InAlN/(In)GaN: Prospect for a Record Performance", IEEE Electron Device Letters, vol. 22, No. 11, Nov. 2001, pp. 510-512 (3 pages).

* cited by examiner

| Al COMPOSITION OF AlGaN | LATTICE CONSTANT OF AXIS a (nm) | SHEET RESISTANCE (Ω/□) |
|---|---|---|
| 0.17 | 0.317591 | 750.5 |
| 0.202 | 0.317345 | 625.6 |
| 0.28 | 0.316744 | 424.4 |
| 0.36 | 0.316128 | 351.1 |
| 0.47 | 0.315281 | 535.2 |
| 0.55 | 0.314665 | 46670 |

SEMICONDUCTOR DEVICE AND METHOD FOR MANUFACTURING THE SEMICONDUCTOR DEVICE

CROSS-REFERENCE TO RELATED APPLICATIONS

This application is based upon and claims the benefit of priority of the prior Japanese Patent Application No. 2016-085263 filed on Apr. 21, 2016, the entire contents of which are incorporated herein by reference.

FIELD

The embodiments discussed herein are related to a semiconductor device and a method for manufacturing the semiconductor device.

BACKGROUND

A material including a nitride semiconductor such as GaN, AlN, InN or a mixed crystal of the nitride semiconductor has wide band gap and is used for high output electronic devices, short wavelength light emitting devices, or the like. Among the devices, technologies for a field effect transistor (FET), particularly, a high electron mobility transistor (HEMT) are being developed (see, for example, Patent Document 1). The HEMT using a nitride semiconductor is used for devices such as a high output/high efficiency amplifier and a high-power switching device.

One example of an FET using a nitride semiconductor is an HEMT that uses GaN as its channel layer and uses AlGaN as its barrier layer. In the HEMT, piezoelectric polarization occurs due to strain that occurs in the AlGaN of the barrier layer caused by the difference of lattice constant between AlGaN and GaN. The piezoelectric polarization causes high concentration 2 DEG (Two-Dimensional Electron Gas) to be generated in the channel layer. Another example of an FET using a nitride semiconductor is an HEMT that uses GaN in its channel layer and uses InAlN in its barrier layer for enabling high output. The use of InAlN in the barrier layer induces high concentration 2 DEG because InAlN has large spontaneous-polarization. Thereby, the HEMT using InAlN in its barrier layer allows a larger amount of drain current to flow compared to the HEMT using AlGaN in its barrier layer.

RELATED DOCUMENTS

[Patent Document 1] Japanese Laid-Open Patent Publication No. 2002-359256
[Patent Document 2] Japanese Laid-Open Patent Publication No. 2011-228428
[Patent Document 3] Japanese Laid-Open Patent Publication No. 2014-90065
[Non-Patent Document] J. Kuzmik, "Power electronics on InAlN/(In)GaN: Prospect for a record performance", IEEE Electron Device Lett., 22, 510 (2001)

However, in a case where InAlN is used in the barrier layer of the HEMT, In desorbs from InAlN if the processing temperature is high during a manufacturing process of the HEMT. As a result, sheet resistance becomes high and a desired characteristic cannot be attained for the HEMT. Therefore, the choices for selecting a manufacturing process to be used becomes limited in such case where InAlN is used in the barrier layer of the HEMT.

SUMMARY

According to an aspect of the invention, there is provided a semiconductor device includes a substrate, a first semiconductor layer formed over the substrate, a second semiconductor layer formed over the first semiconductor layer, a third semiconductor layer formed over the second semiconductor layer, and a gate electrode, a source electrode, and a drain electrode that are formed over the third semiconductor layer. The first semiconductor layer includes a first nitride semiconductor. The second semiconductor includes a second nitride semiconductor. The third semiconductor layer includes a third nitride semiconductor. The concentration of oxygen included in the second semiconductor layer is less than $5.0 \times 10^{18}$ cm$^{-3}$. The concentration of oxygen included in the third semiconductor layer is greater than or equal to $5.0 \times 10^{18}$ cm$^{-3}$.

The object and advantages of the invention will be realized and attained by means of the elements and combinations particularly pointed out in the claims.

It is to be understood that both the foregoing general description and the followed detailed description are exemplary and explanatory and are not restrictive of the invention, as claimed.

DESCRIPTION OF EMBODIMENTS

Next, embodiments of the present invention are described.

First Embodiment

As one method for reducing the sheet resistance of a HEMT using GaN as its channel layer and AlGaN as its barrier layer, there is a method of increasing the Al composition in the barrier layer. However, increasing the Al composition in the AlGaN constituting the barrier layer may increase the strain caused by the difference of lattice constant between AlGaN and GaN. If the Al composition becomes greater than or equal to a predetermined value, cracks or the like may be formed. This may result to an increase of sheet resistance rather a reduction of sheet resistance. In the description of the embodiments of the present invention, the term "Al composition of AlGaN" refers to the value "x" in a case of "$Al_xGa_{1-x}N$".

Figure 1A:
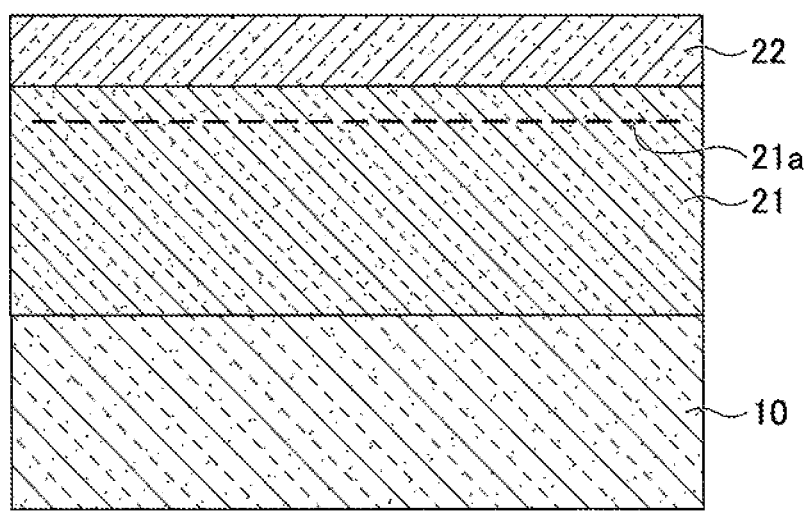
FIGS. 1A and 1B are schematic diagrams for describing samples having an AlGaN layer formed above an i-GaN layer.
Figure 1B:
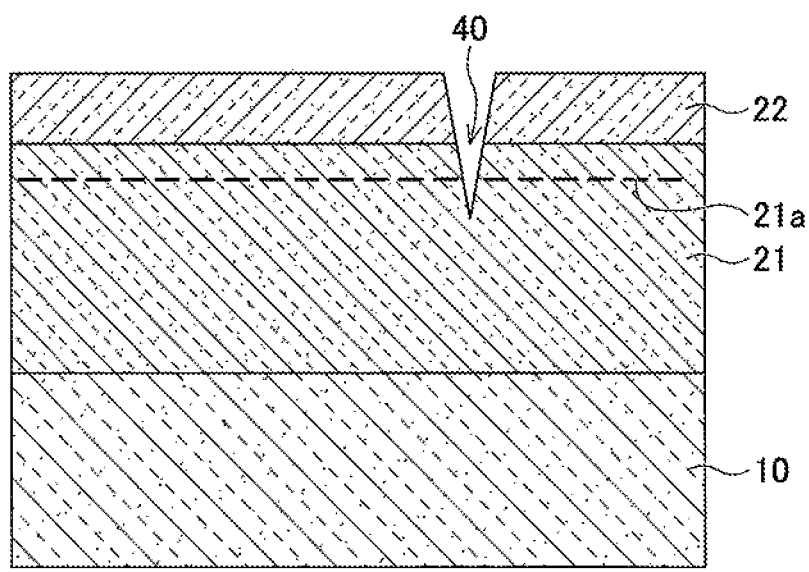

Such increase of sheet resistance is described with reference to FIGS. 1A, 1B, and 2. FIG. 1A is a schematic diagram illustrating a configuration of a sample including a substrate 10 over which an i-GaN layer 21 serving as a channel layer and an i-AlGaN layer 22 serving as an barrier layer are formed. According to the configuration of this sample, a 2 DEG 21a is generated in the i-GaN layer 21 at the vicinity of an interface between the i-GaN layer 21 and the i-AlGaN layer. Note that an HEMT using GaN as its channel layer and AlGaN as its barrier layer is fabricated by forming a gate electrode, a source electrode, and a drain electrode over the i-AlGaN layer 22 of the sample illustrated in FIG. 1A.

Figures 2, 3:
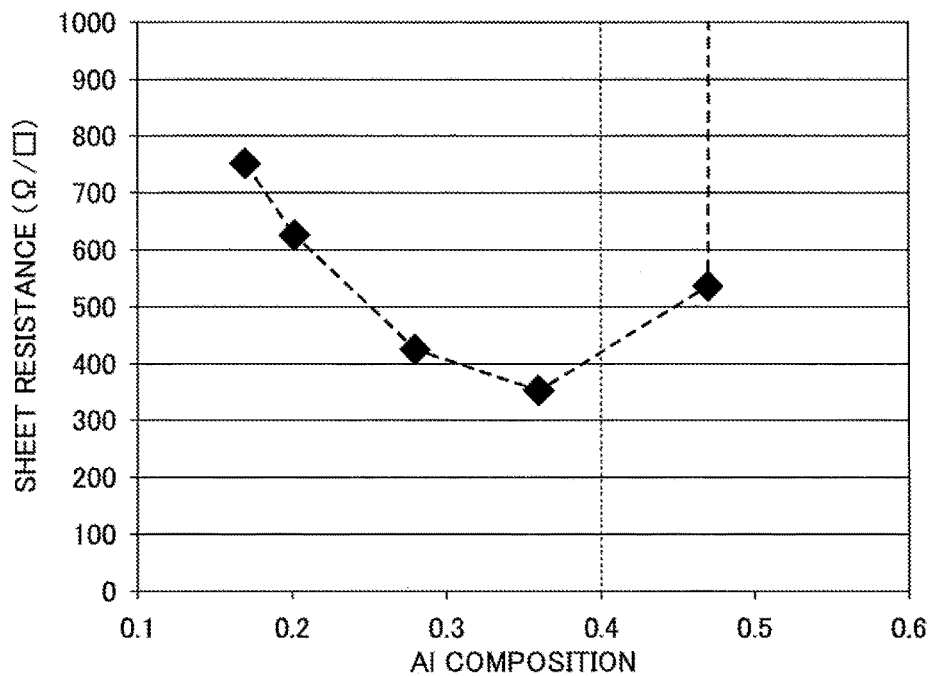
FIG. 2 is a graph illustrating a correlation between an Al composition of AlGaN and sheet resistance.
FIG. 3 is a table illustrating a correlation between an Al composition of AlGaN, a lattice constant of an axis a, and a sheet resistance.

FIG. 2 is a graph illustrating a relationship between sheet resistance and the Al composition of the i-AlGaN 22 serving as the barrier layer. The sheet resistance is a measured value obtained by non-contact measurement using eddy current. As illustrated in FIG. 2, the sheet resistance decreases as the Al composition of the i-AlGaN layer 22 serving as the barrier layer increases and continues to decrease until the Al composition reaches approximately 0.4. However, the sheet resistance increases when the Al composition becomes greater than or equal to 0.4. FIG. 3 is a table illustrating the lattice constant of axis a of the Al composition of AlGaN and the value of the sheet resistance illustrated in FIG. 2. FIG. 3 illustrates that the lattice constant of axis a of the Al composition of AlGaN decreases and that the difference with respect to the lattice constant of the axis a of GaN (approximately 0.318 nm) increases when the Al composition of AlGaN is increased. As a result, the difference of lattice constant increases. Because strain increases along with the increase of lattice constant, sheet resistance gradually decreases when the Al composition of AlGaN in the range where the Al composition is low. For example, the sheet resistance is 351.1Ω/□ when the Al composition is 0.36. However, the sheet resistance increases when the Al composition of AlGaN increases to approximately 0.4 or more. For example, the sheet resistance steeply increases to 46670Ω/□ when the Al composition is 0.55. This is due to the strain between GaN and AlGaN and the generation of a crack 40 (see FIG. 1B) in a case where the Al composition of the i-AlGaN layer 22 serving as the barrier layer becomes approximately greater than or equal to 0.4. In a case where the crack 40 reaches an area where the 2 DEG 21a is formed, electron mobility is degraded because the 2 DEG 21a cannot move beyond the crack 40. As a result, the sheet resistance becomes high.

According to research in view of the above, it is found that the generation of cracks can be prevented and that sheet resistance can be lowered by doping oxygen having a concentration greater than or equal to a predetermined value to the AlGaN serving as the barrier layer. Further, sheet resistance can be further lowered by forming non-doped AlGaN to an area between GaN and AlGaN doped with oxygen.

Figure 4A:
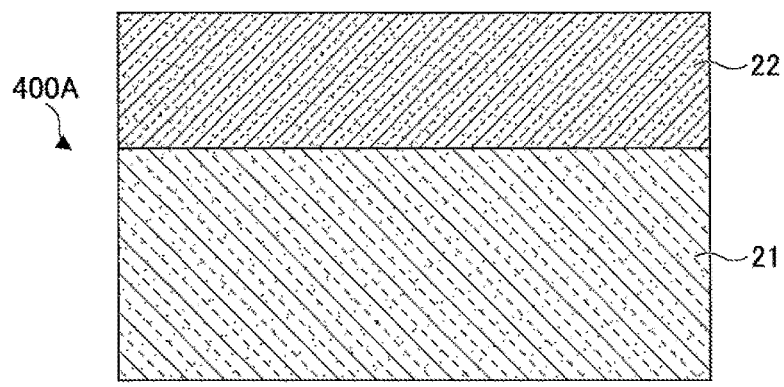
FIGS. 4A-4C are schematic diagrams illustrating samples having an AlGaN layer formed above an i-GaN layer.
Figure 4B:
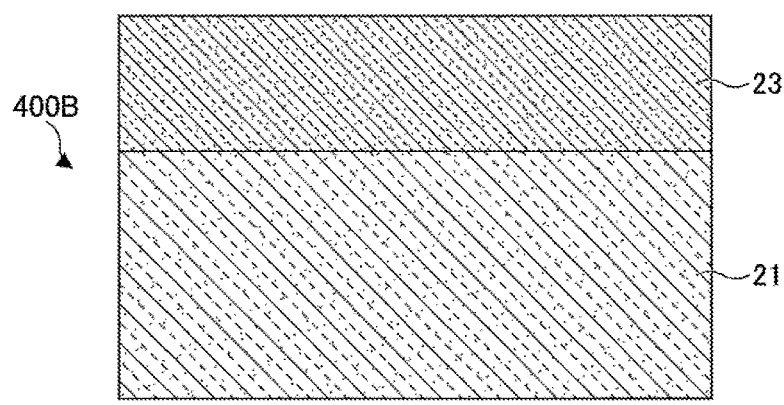
Figure 4C:
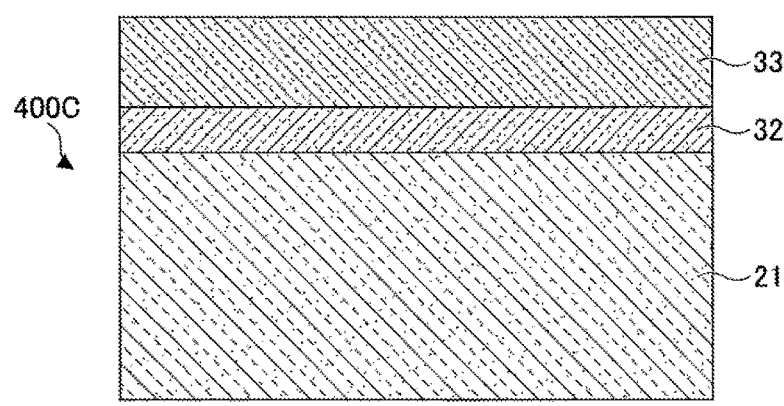

More specifically, samples 400A-400C illustrated in FIGS. 4A-4C were fabricated and evaluated by measuring their sheet resistance with the above-described methods. As illustrated in FIG. 4A, the sample 400A has a structure in which a non-doped i-AlGaN layer 22 is formed over the i-GaN layer 21 formed over a substrate (not illustrated). The i-GaN layer 21 has a film thickness of approximately 1 μm. The i-AlGaN layer 22 has a film thickness of approximately 8 nm. The concentration of the oxygen included in the non-doped i-AlGaN layer 22 is approximately $1.9 \times 10^{18}$ $cm^{-3}$. As illustrated in FIG. 4B, the sample 400B has a structure in which an oxygen-doped AlGaN (AlGaN:O) layer 23 is formed over the i-GaN layer 21 formed over a substrate (not illustrated). The i-GaN layer 21 has a film thickness of approximately 1 μm. The AlGaN layer 23 has a film thickness of approximately 8 nm. The concentration of the oxygen included in the oxygen-doped AlGaN (AlGaN:O) layer 22 is approximately $1.6 \times 10^{19}$ cm$^{-3}$. As illustrated in FIG. 4C, the sample 400C has a structure having a non-doped i-AlGaN layer 32 and an oxygen-doped AlGaN (AlGaN:O) layer 33 layered on the i-GaN layer 21 formed over a substrate (not illustrated). The i-GaN layer 21 has a film thickness of approximately 1 μm. The AlGaN layer 32 has a film thickness of approximately 2 nm. The AlGaN layer 33 has a film thickness of approximately 6 nm. The concentration of the oxygen included in the non-doped AlGaN layer 32 is approximately $1.9 \times 10^{18}$ cm$^{-3}$. The concentration of the oxygen included in the oxygen-doped AlGaN (AlGaN:O) layer 32 is approximately $1.6 \times 10^{19}$ cm$^{-3}$. Note that the Al composition in each of the non-doped i-AlGaN layer 22, the oxygen-doped AlGaN (AlGaN:O) layer 23, the non-doped i-AlGaN layer 32, and the oxygen-doped AlGaN (AlGaN:O) layer is 0.5.

Figure 5:
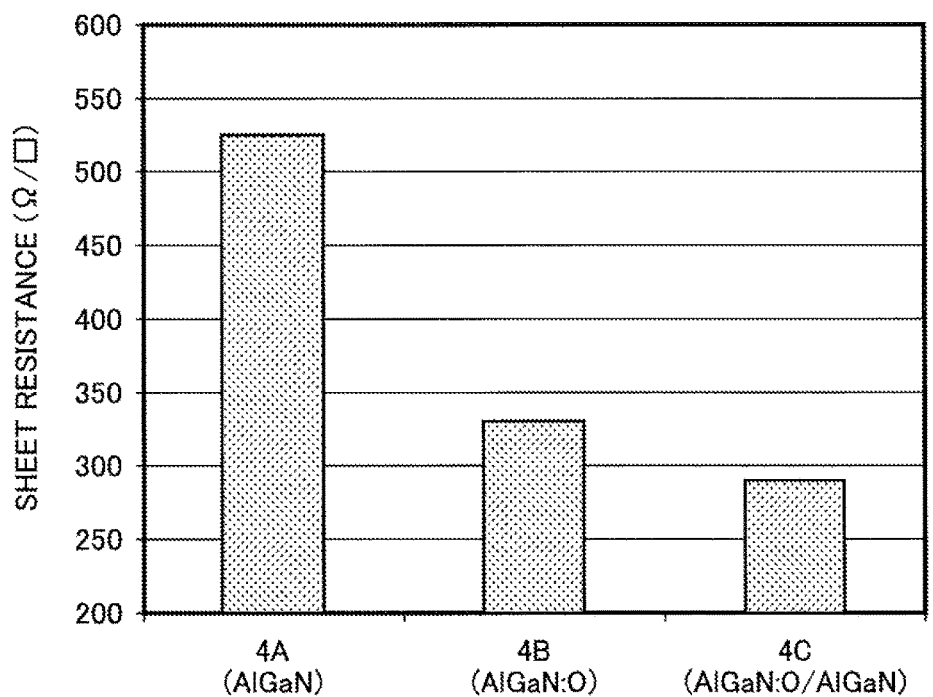
FIG. 5 is a graph illustrating a sheet resistance of the samples illustrated in FIGS. 4A-4C.

As illustrated in FIG. 5, the sheet resistance was approximately 520Ω/□ in the case of the sample 4A in which the non-doped i-AlGaN layer 22 having a film thickness of 8 nm is formed over the i-GaN layer 21. On the other hand, the sheet resistance was approximately 330Ω/□ in the case of the sample 4B in which the oxygen-doped AlGaN (AlGaN:O) having a film thickness of 8 nm is formed over the i-GaN layer 21. Accordingly, sheet resistance can be reduced by doping oxygen to the AlGaN layer formed over the i-GaN layer in a case where the Al composition of the AlGaN layer is 0.5. This is because the doping of oxygen to the AlGaN layer prevents cracks or the like from being created.

More specifically, because the lattice constant of the axis a of the Al$_2$O$_3$ (aluminum oxide) is 0.4758 nm, a crystal structure similar to Al$_2$O$_3$ is created by the increase of oxygen. Thus, compared to an AlGaN layer that is not doped with oxygen, the lattice constant of the oxygen-doped AlGaN layer increases, and the stress caused by the difference of lattice constant between the AlGaN layer and the GaN layer is reduced. Thereby, the generation of cracks or the like is prevented from being created. Note that the sample 400B had a sheet resistance lower than the lowest sheet resistance value of the non-doped AlGaN illustrated in FIG. 2.

As illustrated in FIG. 5, the sheet resistance was approximately 290Ω/□ in the case of the sample 4C in which the non-doped i-AlGaN layer 32 having a film thickness of 2 nm and the oxygen-doped AlGaN (AlGaN:O) having a thickness of 6 nm are layered on the i-GaN layer 21. Accordingly, sheet resistance can be further reduced by forming a non-doped i-AlGaN layer between the i-GaN layer and the oxygen-doped AlGaN (AlGaN:O). The reason that the sheet resistance of the sample 4C is lower than the sheet resistance of the sample 4B is because the forming of the non-doped i-AlGaN layer prevents impurities from scattering due to the oxygen in the oxygen-doped AlGaN (AlGaN:O) layer.

According to the inventor, the concentration of oxygen included in the non-doped i-AlGaN layer is preferably less than $5.0 \times 10^{18}$ cm$^{-3}$. Further, the concentration of oxygen included in the oxygen-doped AlGaN (AlGaN:O) is preferably greater than or equal to $5.0 \times 10^{18}$ cm$^{-3}$, and more preferably, $1.0 \times 10^{19}$ cm$^{-3}$. The semiconductor device of the following embodiments are based on the above-described experiment results.

<Semiconductor Device>

Figure 6:
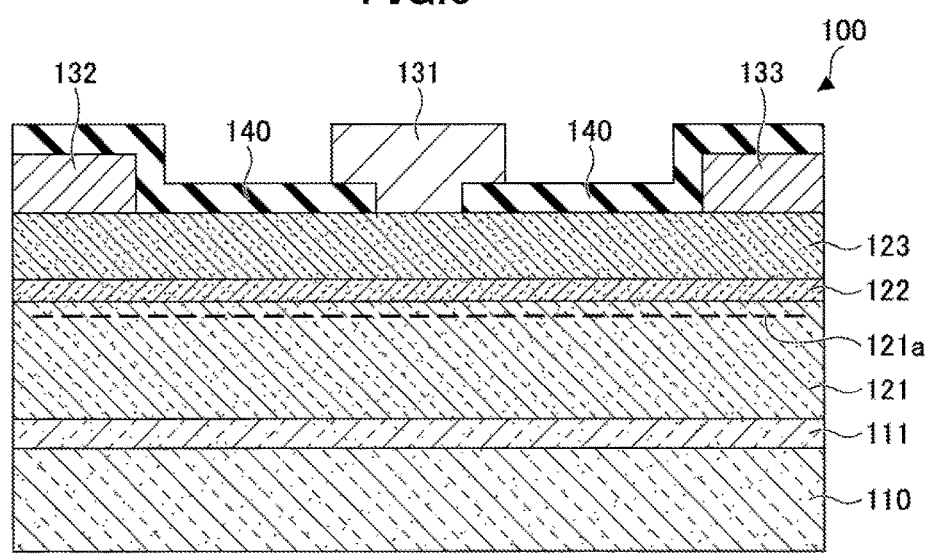
FIG. 6 is a schematic diagram illustrating a semiconductor device according to a first embodiment of the present invention.

First, a semiconductor device 100 according to the first embodiment of the present invention is described with reference to FIG. 6.

In the semiconductor device 100 of the first embodiment, a buffer layer 111, a channel layer 121, a spacer layer 122, and an barrier layer 123 are layered on an Si plane of a substrate 110 formed of, for example, SiC. The buffer layer 111, the channel layer 121, the spacer layer 122, and the barrier layer 123 are layered by epitaxial growth of a nitride semiconductor layer. Accordingly, 2 DEG 121a is generated in the channel layer 121 at the vicinity of the interface between the channel layer 121 and the spacer layer 122. In the description of the embodiments, the channel layer 121 may also be referred to as a first semiconductor layer, the spacer layer 122 may be referred to as a second semiconductor layer, and the barrier layer 123 may be referred to as a third semiconductor layer.

The buffer layer 111 is formed of, for example, AlN or GaN. The channel layer 121 is formed of i-GaN having a film thickness of approximately 2 μm. The main plane serving as the front surface of the channel layer 121 formed by epitaxial growth is a c plane, that is, a (0001) plane.

The spacer layer 122 is formed of i-AlGaN having a film thickness of approximately 2 nm. The Al composition of the spacer layer 122 is 0.5. Because the spacer layer 122 is not doped with an impurity element or the like, the oxygen concentration of the spacer layer 122 is less than $5.0 \times 10^{18}$ cm$^{-3}$. In a case where the Al composition of the spacer layer 122 is expressed in the form of "Al$_y$Ga$_{1-y}$N", the value of "y" is preferably greater than or equal to 0.3 and less than or equal to 1.0. Further, the film thickness of the spacer layer 122 is preferably greater than or equal to 0.5 nm and less than or equal to 4.0 nm.

The barrier layer 123 is formed of AlGaN:O in which AlGaN having a film thickness of approximately 8 nm is doped with oxygen. The Al composition of the barrier layer 123 is 0.5. The oxygen concentration of the barrier layer 123 is approximately $2.0 \times 10^{19}$ cm$^{-3}$. More preferably, the oxygen concentration of the barrier layer 123 is greater than or equal to $5.0 \times 10^{18}$ cm$^{-3}$, and yet more preferably, greater than or equal to $1.0 \times 10^{19}$ cm$^{-3}$. In a case where the Al composition of the barrier layer 123 is expressed in the form of "Al$_z$Ga$_{1-z}$N", the value of "z" is preferably greater than or equal to 0.4 and less than or equal to 0.8. Further, the film thickness of the barrier layer 123 is preferably greater than or equal to 4 nm and less than or equal to 20 nm.

It is to be noted that, in a case where the Al composition of the barrier layer 123 is less than 0.4, the reduction of sheet resistance may be difficult to achieve. In a case where the Al composition of the barrier layer 123 is greater than 0.8, it may be difficult to relieve strain even if AlGaN is doped with oxygen. Therefore, the Al composition of the barrier layer 123 is preferably greater than or equal to 0.4 and less than or equal to 0.8. Further, in a case where the film thickness of the barrier layer 123 is less than 4 nm, the amount of two-dimensional electron gas generated may be small and the sheet resistance may increase. In a case where the film thickness of the barrier layer 123 is greater than 20 nm, high frequency characteristics may be degraded due to the increase in the distance between the gate electrode and the two-dimensional electron gas. Therefore, the film thickness of the barrier layer 123 is preferably greater than or equal to 4 nm and less than or equal to 20 nm.

A gate electrode 131, a source electrode 132, and a drain electrode 133 are formed over the barrier layer 123. Further, protection films 140 formed of SiN or the like are provided between the gate electrode 131 and the source electrode 132 and between the gate electrode 131 and the drain electrode 133 above the barrier layer 123.

In the semiconductor device 100 of the first embodiment, the spacer layer 122 formed of i-AlGaN and the barrier layer 123 formed of AlGaN:O are layered on the channel layer formed of i-GaN in this order. Thereby, sheet resistance can be reduced and drain current can be increased.

<Method for Manufacturing Semiconductor Device>

Next, a method for manufacturing a semiconductor device according to the first embodiment of the present invention is described with reference to FIGS. 7A to 9.

Figure 7A:
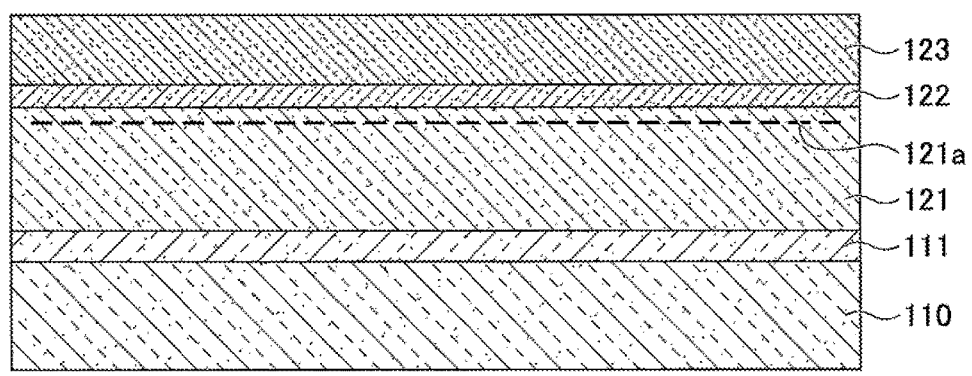
FIGS. 7A and 7B are schematic diagrams illustrating processes of a method for manufacturing a semiconductor device according to the first embodiment of the present invention (part 1)

First, as illustrated in FIG. 7A, the buffer layer 111, the channel layer 121, the spacer layer 122, and the barrier layer 123 are layered by epitaxial growth of a nitride semiconductor layer. Thereby, 2 DEG 121a is generated in the channel layer 121 at the vicinity of the interface between the channel layer 121 and the spacer layer 122. The nitride semiconductor layer is formed by epitaxial growth in which MOVP (Metal Organic Vapor Phase Epitaxy) is performed on the Si plane of the substrate 110.

Although the substrate 110 is formed of a SiC substrate, other substrates such as a sapphire substrate, an Si substrate, or a GaN substrate may be used as the substrate 110. The buffer layer 111 is formed of, for example, AlN or GaN. The channel layer 121 is formed of i-GaN. The spacer layer 122 is formed of i-$Al_{0.5}Ga_{0.5}N$. The barrier layer 123 is $Al_{0.5}Ga_{0.5}N$:O.

When depositing the nitride semiconductor layer with MOVPE, TMA (trimethyl aluminum) is used as the raw material gas of Al and TMG (trimethyl gallium) is used as the raw material gas of Ga. Further, $NH_3$ (ammonia) is used as the raw material gas of N. In a case of forming the buffer layer 111 and the channel layer 121, the raw material gases used for forming the buffer layer 111 and the channel layer 121 are supplied to a reaction furnace of an MOVPE apparatus by using hydrogen ($H_2$) as a carrier gas and heated at a growth temperature of 600° C. to 1200° C. Further, the growth pressure for performing epitaxial growth on the nitride semiconductor layer using MOVPE is 5 kPa to 100 kPa.

When forming the spacer layer 122 according to the first embodiment, the substrate is heated to a temperature of 1000° C. along with supplying hydrogen ($H_2$) as a carrier gas into the reaction furnace of the MOVPE apparatus. Because hydrogen has a reduction property and is capable of coupling with oxygen included in the raw material gas, oxygen elements can be removed by using hydrogen as the carrier gas. Accordingly, the spacer layer 122 can be formed having a low oxygen concentration that is less than $5.0 \times 10^{18}$ $cm^{-3}$. When forming the barrier layer 123 according to the first embodiment, the substrate is heated to a temperature less than the temperature for forming the spacer layer 122 (in this example, 700° C.) along with supplying nitrogen ($N_2$) as a carrier gas into the reaction furnace of the MOVPE apparatus. Because nitrogen does not have a reduction property as hydrogen, nitrogen does not serve to remove oxygen elements included in the raw material gas or the like. Accordingly, oxygen is auto-doped to the barrier layer 123. Thereby, the barrier layer 123 can be formed to have an oxygen concentration of approximately $2.0 \times 10^{19}$ $cm^{-3}$.

Then, although not illustrated in the drawings, a device separation area for separating devices is formed. More specifically, photo-resist is applied onto the barrier layer 123, exposed with an exposing device, and developed to form a resist pattern including an opening corresponding to the area where the device separation area is to be formed.

Then, the device separation area is formed by implanting an argon (Ar) ion to a part of the nitride semiconductor layer over which no resist pattern is formed. Alternatively, the device separation area may be formed by removing (e.g., dry-etching (RIE (Reactive Ion Etching)) a part of the nitride semiconductor layer over which no resist pattern is formed. After the device separation area is formed, the resist pattern is removed by using, for example, an organic solvent.

Figure 7B:
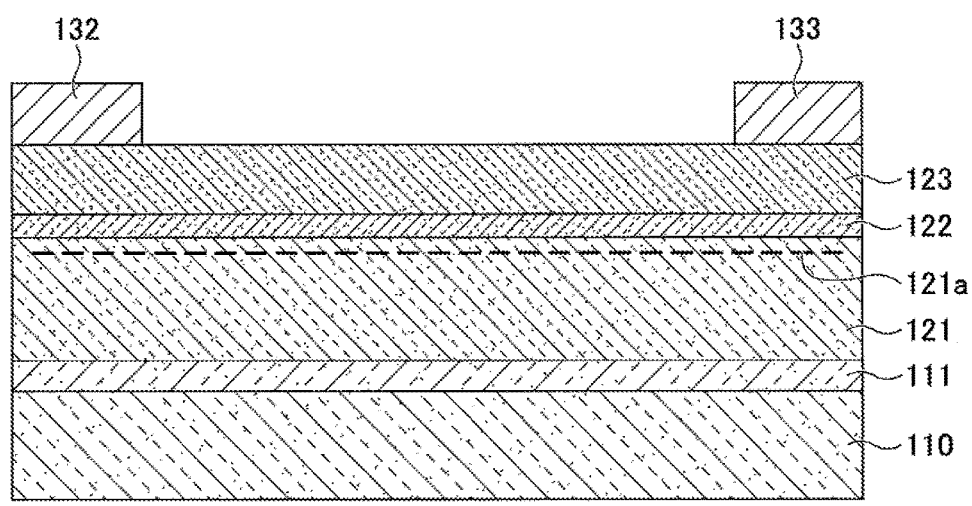

Then, as illustrated in FIG. 7B, the source electrode 132 and the drain electrode 133 are formed over the barrier layer 123. More specifically, photo-resist is applied onto the barrier layer 123, exposed with an exposing device, and developed to form a resist pattern (not illustrated) including openings corresponding to the areas where the source electrode 132 and the drain electrode 133 are to be formed. Then, a metal layered film formed of Ta/Al is deposited by performing vacuum deposition. Then, the metal layered film is immersed in an organic solvent. Then, the resist pattern and the metal layered film formed over the resist pattern are removed by performing lift-off. After the removal, the remaining parts of the metal layered film form the source electrode 132 and the drain electrode 133. Note that the metal layered film of Ta/Al is formed by forming a Ta film having a film thickness of approximately 20 nm and a Al film having a film thickness of approximately 200 nm over the barrier layer 123 in this order. Then, the metal layered film is placed in a nitrogen atmosphere and heated at a temperature between 400° C. and 1000° C. (e.g., 550° C.). Thereby, ohmic contact of the source electrode 132 and the drain electrode 133 is achieved.

Figure 8A:
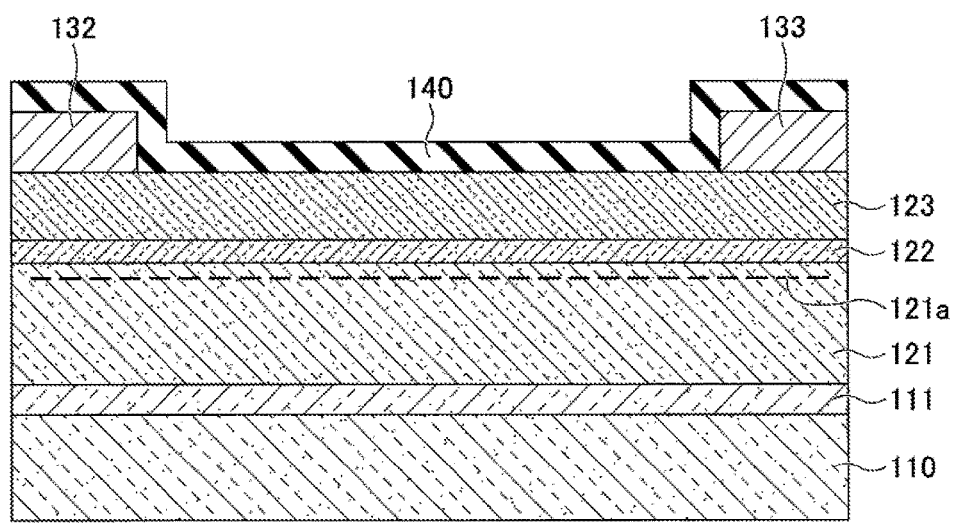
FIGS. 8A and 8B are schematic diagrams illustrating processes of the method for manufacturing a semiconductor device according to the first embodiment of the present invention (part 2)

Then, as illustrated in FIG. 8A, the protection film 140 is formed over the barrier layer 123. The protection film 140 is formed by depositing (e.g., ALD (chemical vapor deposition), sputtering) SiN having a film thickness between 2 nm to 500 nm (e.g., 100 nm). Note that a material other than SiN may be used to form the protection film 140. For example, oxides, nitrides, and oxynitrides of Si, Al, Hf, Zr, Ti, Ta, and W may be used to form the protection film 140.

Figure 8B:
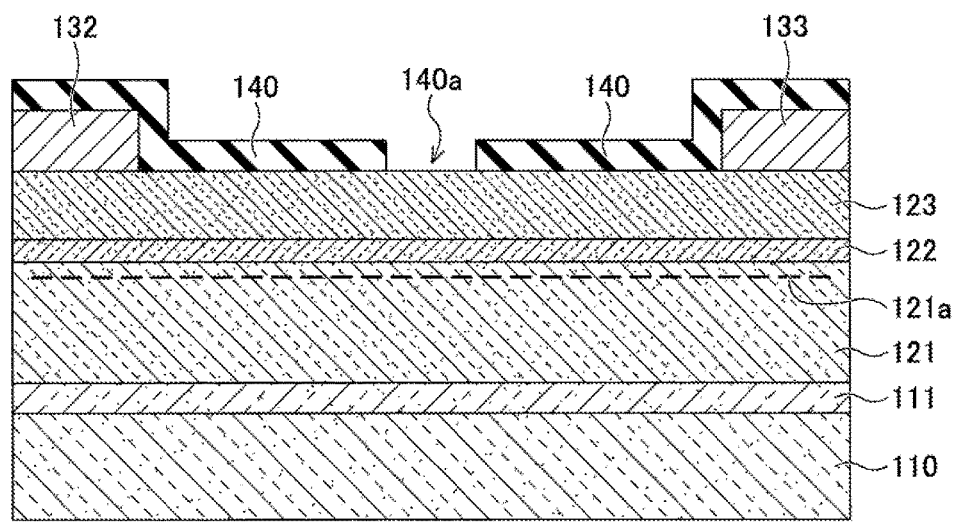

Then, as illustrated in FIG. 8B, an opening 140a is formed in a part of the protection film 140 corresponding to the area where the gate electrode 131 is to be formed. More specifically, photo-resist is applied onto the protection film 140, exposed with an exposing device, and developed to form a resist pattern (not illustrated) including an opening corresponding to the area where the gate electrode 131 is to be formed. Then, the electrode supply layer 123 becomes exposed by removing (e.g., dry-etching (RIE (Reactive Ion Etching) with a fluoride type etching gas) the SiN film exposed at the opening of the resist pattern. Thereby, the opening 140a is formed in a part of the protection film 140 corresponding to the area where the gate electrode 131 is to be formed. Then, the resist pattern (not illustrated) is removed with, for example, an organic solvent. Alternatively, in forming the opening 140a in the protection film 140, a chloride type etching gas may be used as the etching gas. Alternatively, a wet etching process that uses fluoride or a buffered fluoride may be used to etch the exposed SiN film.

Figure 9:
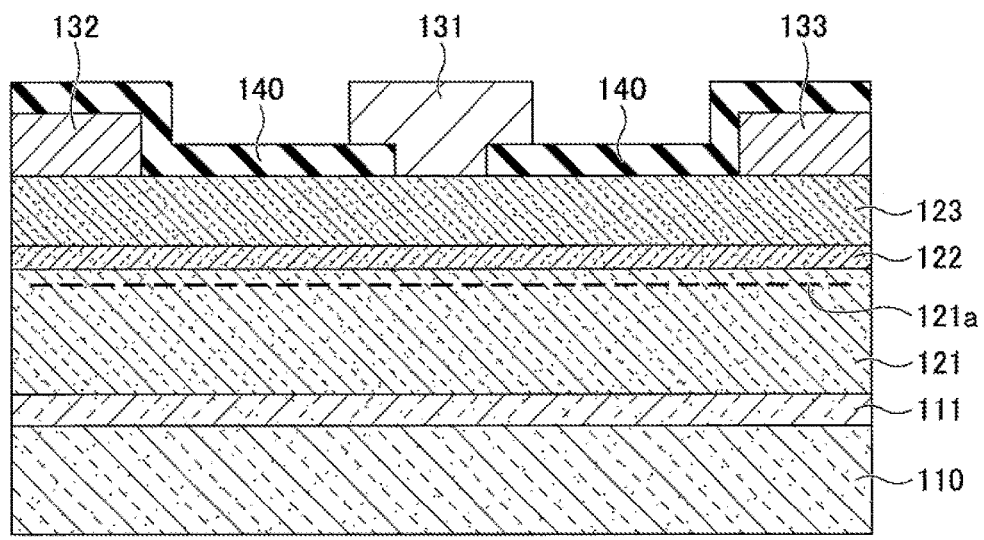
FIG. 9 is a schematic diagram illustrating a process of the method for manufacturing a semiconductor device according to the first embodiment of the present invention.

Then, as illustrated in FIG. 9, the gate electrode 131 is formed over a part of the barrier layer 123 exposed in the opening part 140a of the protection film 140. More specifically, photo-resist is applied onto the protection film 140, the barrier layer 123, the source electrode 132, and the drain electrode, exposed with an exposing device, and developed to form a resist pattern (not illustrated) including an opening corresponding to the area where the gate electrode 131 is to be formed. Then, a metal layered film formed of Ni/Au is deposited by performing vacuum deposition. Then, the metal layered film is immersed in an organic solvent. Then, the resist pattern and the metal layered film formed over the resist pattern are removed by performing lift-off. After the removal, the remaining part of the metal layered film forms the gate electrode 131. Note that the metal layered film of Ni/Au is formed by forming a Ni film having a film thickness of approximately 30 nm and a Au film having a film thickness of approximately 400 nm over the barrier layer 123 in this order.

By performing the above-described processes, the semiconductor device 100 of the first embodiment can be manufactured.

Note that the gate electrode 131, the source electrode 132, and the drain electrode 133 are merely examples and are not limited to the configuration described above. For example, the gate electrode 131, the source electrode 132, and the drain electrode 133 may be formed of a single layer or multiple layers and formed from different materials. Further, the method for forming the gate electrode 131, the source electrode 132, and the drain electrode 133 is not limited to the method described above. In a case where ohmic contact of the source electrode 132 and the drain electrode 133 is achieved immediately after the deposition process, the thermal process does not necessarily need to be performed. Further, the thermal process may be performed after the deposition of the gate electrode 131. Further, the semiconductor device 100 of the first embodiment is not limited to the above-described Schottky type gate structure. For example, the semiconductor device 100 of the first embodiment may have a MIS (Metal Insulator Semiconductor) type gate structure. Further, a gate recess may be formed by removing a part of the barrier layer 123 immediately below the gate electrode 131.

Second Embodiment (Semiconductor Apparatus)

Figure 10:
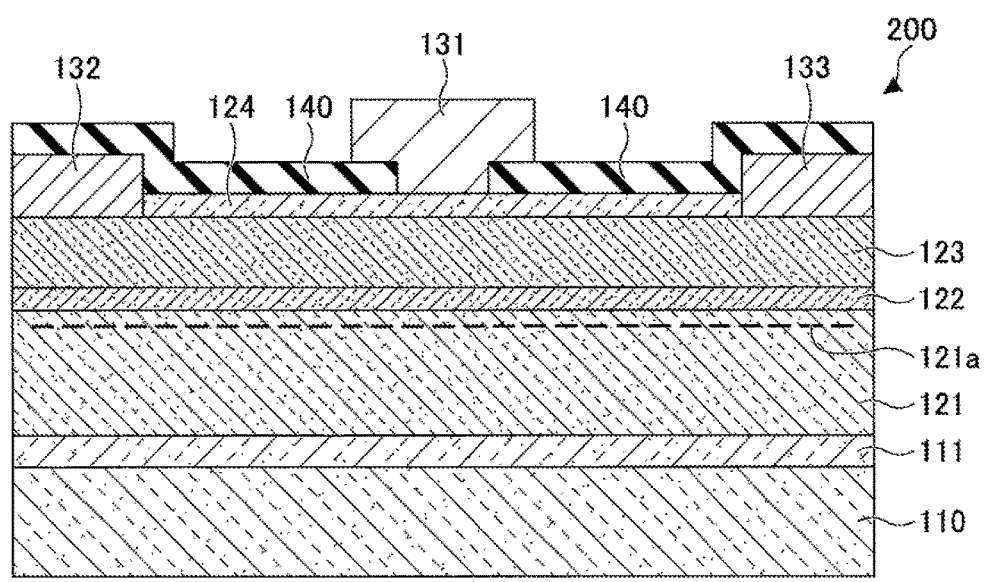
FIG. 10 is a schematic diagram illustrating a configuration of a semiconductor device according to a second embodiment of the present invention.

Next, a semiconductor apparatus 200 according to the second embodiment of the present invention is described with reference to FIG. 10. In the second embodiment, like components are denoted by like reference numerals as of those of the first embodiment and are not further explained.

The semiconductor apparatus 2 according to the second embodiment has a configuration in which a cap layer 123 made of n-GaN or the like is formed over the barrier layer 123 of the semiconductor device 100 of the first embodiment. Both the cap layer 124 and the channel layer 121 are formed of the same GaN and have the same lattice constant. Because the spacer layer 122 and the barrier layer 123 are provided between the channel layer 121 and the cap layer 124 formed of GaN having the same lattice constant, generation of cracks or the like can be further prevented. Thus, on-state resistance can be reduced.

According to the second embodiment, the cap layer 124 is formed of n-GaN having a film thickness of 5 nm. Si serving as an n-type impurity element is doped to the cap layer 124 with a concentration of approximately $5.0 \times 10^{18}$ $cm^{-3}$. According to the second embodiment, the gate electrode 131 is formed over the cap layer 124, and the protection film 140 is also formed over the cap layer 124. In the description of the embodiments, the cap layer 124 may also be referred to as a fourth semiconductor layer.

(Method for Manufacturing Semiconductor Device)

Next, a method for manufacturing the semiconductor device of the second embodiment is described with reference to FIGS. 11A to 13B.

Figure 11A:
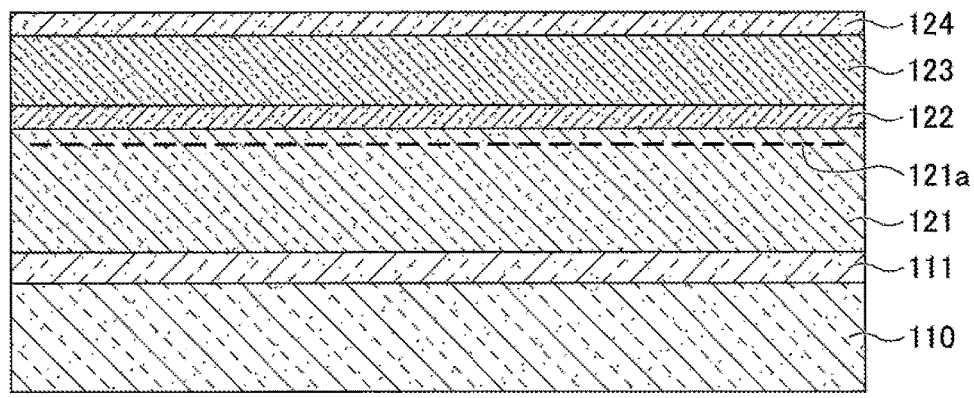
FIGS. 11A and 11B are schematic diagrams illustrating processes of a method for manufacturing a semiconductor device according to the second embodiment of the present invention (part 1)

First, as illustrated in FIG. 11A, the buffer layer 111, the channel layer 121, the spacer layer 122, the barrier layer 123, and the cap layer 124 are formed over the substrate 110 by performing epitaxial growth on a nitride semiconductor layer.

When depositing the nitride semiconductor layer, TMG is used as the raw material gas of Ga, and $NH_3$ is used as the raw material gas of N. Further, silane ($SiH_4$) is used as the Si to be doped as the n-type impurity element. These raw material gases are supplied to a reaction furnace of an MOVPE apparatus by using hydrogen ($H_2$) as a carrier gas and heated at a growth temperature of 600° C. to 1200° C. Further, the growth pressure for performing the epitaxial growth is 5 kPa to 100 kPa. Thereby, the cap layer 124 made of n-GaN is formed. The cap layer 124 is formed having a film thickness of 5 nm. Further, Si serving as the n-type impurity element is doped to the cap layer 124 with a concentration of approximately $5.0 \times 10^{18}$ $cm^{-3}$. Then, although not illustrated in the drawings, a device separation area for separating devices is formed.

Figure 11B:
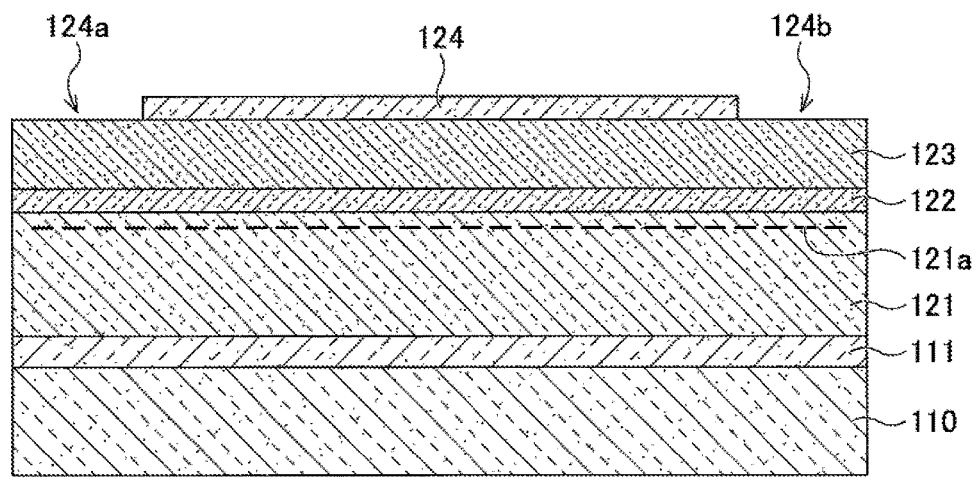

Then, as illustrated in FIG. 11B, openings 124a, 124b are formed by removing the cap layer 124 from areas where the source electrode 132 and the drain electrode 133 are to be formed. Thereby, the barrier layer 123 is exposed. More specifically, first, photoresist is applied over the cap layer 124. Then, the photoresist is exposed and developed. Thereby, a resist pattern (not illustrated) is formed with openings corresponding to areas where the source electrode 132 and the drain electrode 133 are to be formed. Then, dry-etching such as RIE (Reactive Ion Etching) is performed on the resist pattern in the opening exposing the cap layer 124. In removing of the cap layer 124, a chlorine type gas is used in the dry-etching. Accordingly, the surface of the barrier layer 123 is exposed. Thereby, openings 124a, 124b are formed in areas of the cap layer 124 where the source electrode 132 and the drain electrode 133 are to be formed.

Figure 12A:
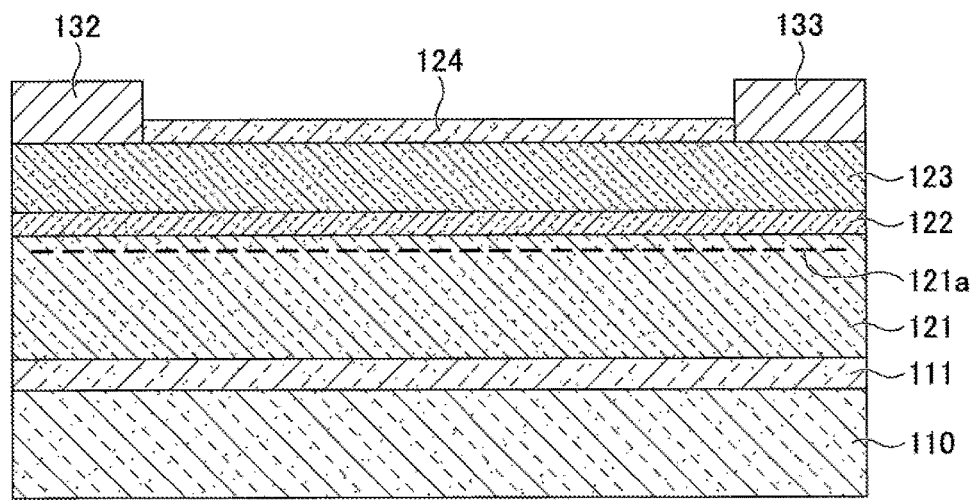
FIGS. 12A and 12B are schematic diagrams illustrating processes of a method for manufacturing a semiconductor device according to the second embodiment of the present invention (part 2)

Then, as illustrated in FIG. 12A, the source electrode 132 and the drain electrode 133 formed over the barrier layer 123 exposed in the openings 124a, 124b of the cap layer 124. More specifically, the source electrode 132 is formed over the part of the barrier layer 123 exposed in the opening 124a of the cap layer 124, and the drain electrode 133 is formed over the part of the barrier layer 123 exposed in the opening 124b of the cap layer 124.

Figure 12B:
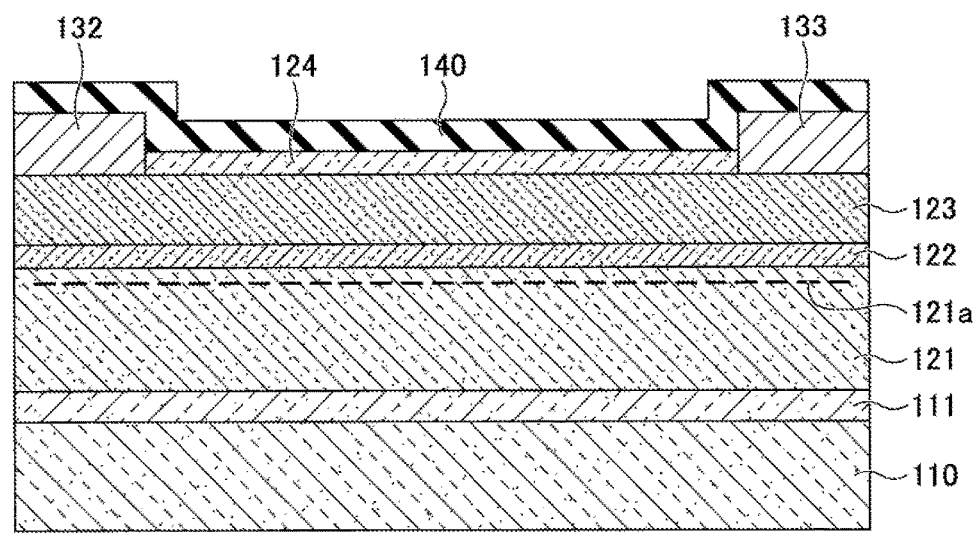

Then, as illustrated in FIG. 12B, the protection film 140 is formed over the cap layer 124.

Figure 13A:
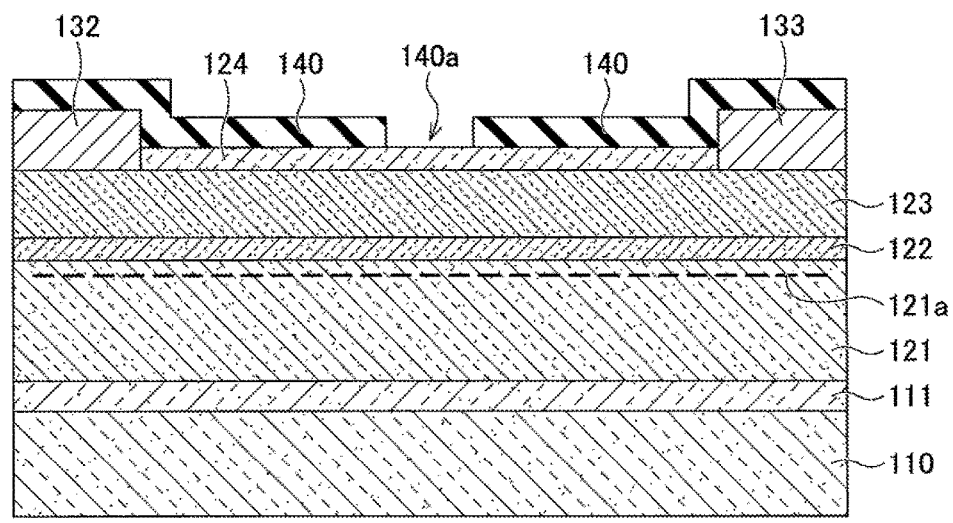
FIGS. 13A and 13B are schematic diagrams illustrating processes of a method for manufacturing a semiconductor device according to the second embodiment of the present invention (part 3)

Then, as illustrated in FIG. 13A, the opening 140a is formed in the area of the protection film 140 where the gate electrode 131 is to be formed. By forming the opening 140a, the cap layer 124 is exposed.

Figure 13B:
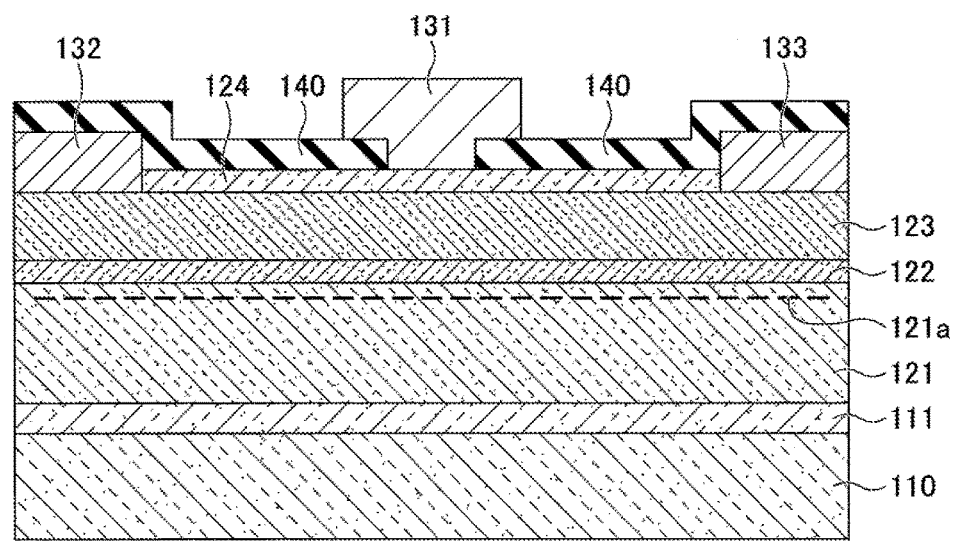

Then, as illustrated in FIG. 13B, the gate electrode 131 is formed over the part of the cap layer 124 exposed in the opening 140a of the protection film 140.

By performing the above-described processes, the semiconductor device 200 of the second embodiment can be manufactured. Note that the details other than those described in the second embodiment are the same as the details described in the first embodiment.

Third Embodiment (Semiconductor Apparatus)

Figure 14:
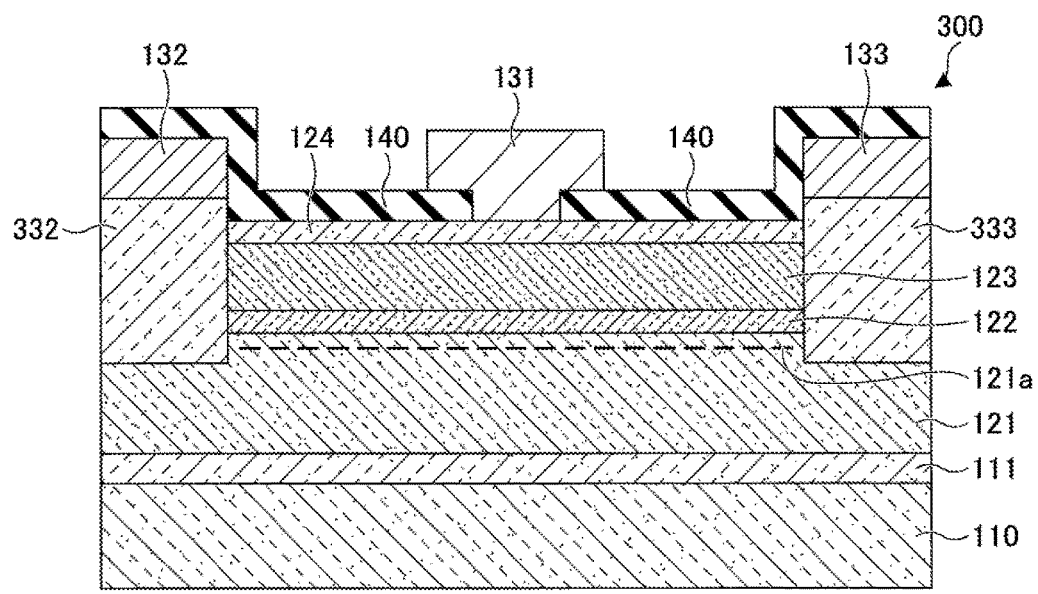
FIG. 14 is a schematic diagram illustrating a configuration of a semiconductor device according to a third embodiment of the present invention.

Next, a semiconductor apparatus 300 according to the third embodiment of the present invention is described with reference to FIG. 14. In the third embodiment, like components are denoted by like reference numerals as of those of the first and second embodiments and are not further explained. The semiconductor apparatus 300 according to the third embodiment has a configuration in which contact areas 332, 333 are formed in areas of the nitride semiconductor layer directly below the source electrode 132 and the drain electrode 133 of the semiconductor device 200 of the second embodiment. According to the third embodiment, the contact areas 332, 333 are formed by further growing the n-GaN doped with an n-type impurity element. According to the third embodiment, Si serving as the n-type impurity element is doped to the contact areas 332, 333 with a concentration of approximately $5.0 \times 10^{18}$ cm$^{-3}$.

(Method for Manufacturing Semiconductor Device)

Next, a method for manufacturing the semiconductor device of the third embodiment is described with reference to FIGS. 15A to 18.

Figure 15A:
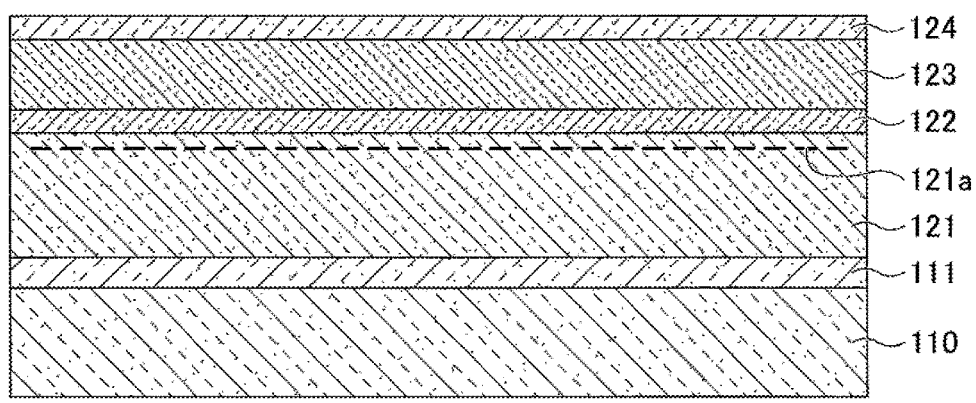
FIGS. 15A and 15B are schematic diagrams illustrating processes of a method for manufacturing a semiconductor device according to the third embodiment of the present invention (part 1)

First, as illustrated in FIG. 15A, the buffer layer 111, the channel layer 121, the spacer layer 122, the barrier layer 123, and the cap layer 124 are formed over the substrate 110 by performing epitaxial growth on a nitride semiconductor layer.

Figure 15B:
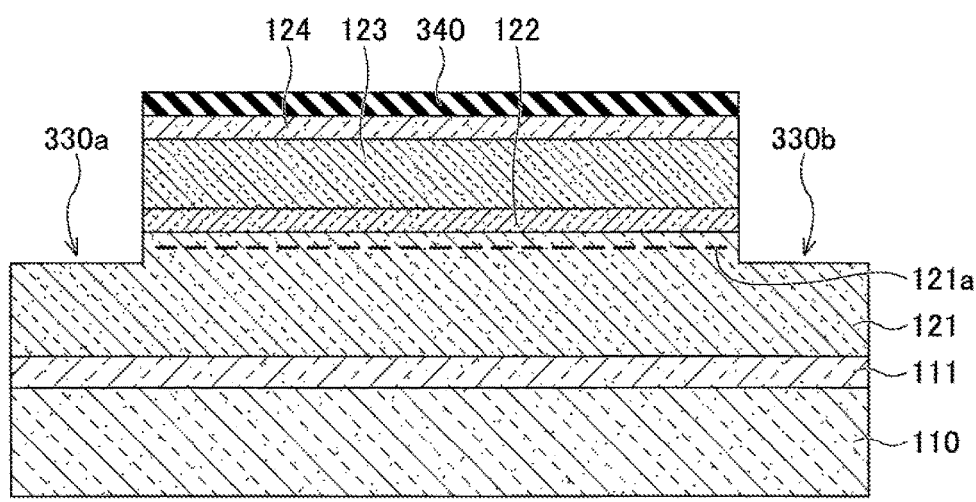

Then, as illustrated in FIG. 15B, parts of the cap layer 124, the barrier layer 123, the spacer layer 122, the channel layer 121 are removed in areas where the source electrode 132 and the drain electrode 133 are to be formed. More specifically, a SiO$_2$ film is deposited over the cap layer 124 by thermal CVD (Chemical Vapor Deposition). Then, photoresist is applied over the SiO$_2$ film. Then, the photoresist is exposed and developed. Thereby, a resist pattern (not illustrated) is formed with openings corresponding to areas where the source electrode 132 and the drain electrode 133 are to be formed. Then, dry-etching such as RIE (Reactive Ion Etching) is performed on the area of the SiO$_2$ film where the resist pattern is not formed. By the removal of the area of the SiO$_2$ film, the remaining SiO$_2$ film becomes a SiO$_2$ hard mask 340. Then, the resist pattern (not illustrated) is removed with, for example, an organic solvent. Then, opening 330a, 330b are formed by dry-etching (e.g., RIE) parts of the cap layer 124, the barrier layer 123, the spacer 122, and the channel layer 121 corresponding to areas where the SiO$_2$ hard mask 340 is not formed. In performing the dry-etching process, a chloride type etching gas may be used as the etching gas.

Figure 16A:
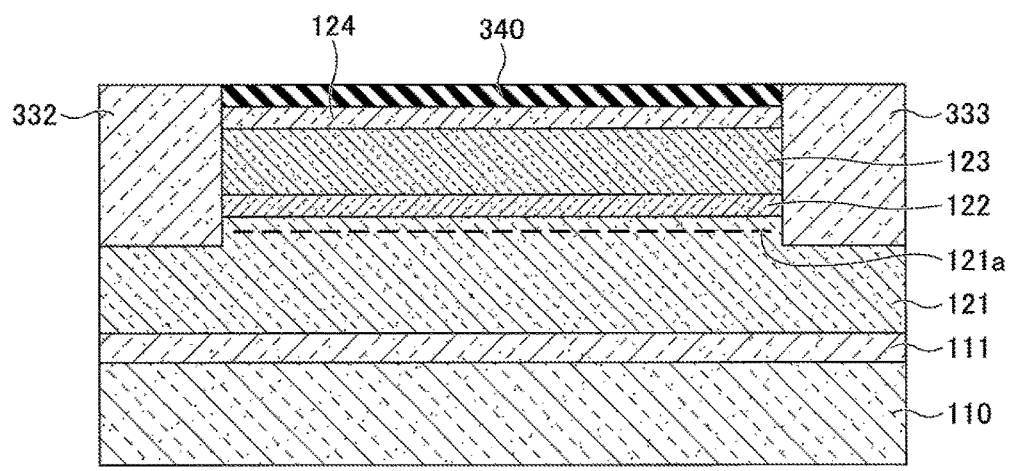
FIGS. 16A and 16B are schematic diagrams illustrating processes of a method for manufacturing a semiconductor device according to the third embodiment of the present invention (part 2)

Then, as illustrated in FIG. 16A, the contact areas 332, 333 are formed in the openings 330a, 330b by epitaxial growth of n-GaN using MOVPE. According to the n-GaN of this embodiment, crystal growth occurs on a crystal plane of i-GaN forming the channel layer 121 whereas crystal growth does not occur on the SiO$_2$ hard mask 340 having an amorphous crystal state. By the epitaxial growth of N—GaN, the contact area 332 is formed in the opening 330a and the contact area 333 is formed in the opening 330b.

When forming the contact areas 332, 333, TMG is used as the raw material gas of Ga, and NH$_3$ is used as the raw material gas of N. Further, silane (SiH$_4$) is used as the Si to be doped as the n-type impurity element. These raw material gases are supplied to a reaction furnace of an MOVPE apparatus by using hydrogen (H$_2$) as a carrier gas and heated at a growth temperature of 600° C. to 1200° C. Further, the growth pressure for performing the epitaxial growth is 5 kPa to 100 kPa. Thereby, the contact areas 332, 333 is doped with Si (serving as the n-type impurity element) with a concentration of approximately $5.0 \times 10^{18}$ cm$^{-3}$. Accordingly, the contact area 332 is formed in the opening 330a and the contact area 333 is formed in the opening 330b.

Figure 16B:
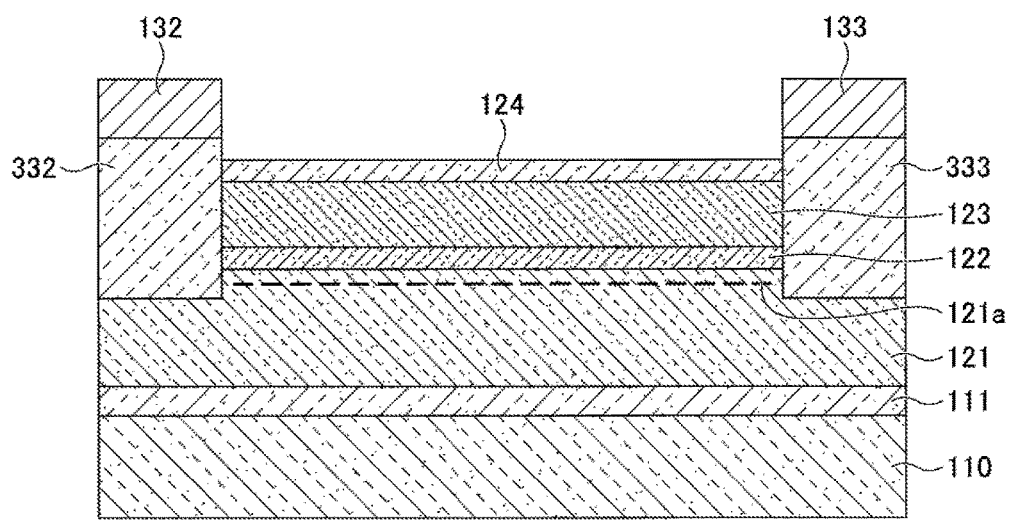

Then, after the SiO$_2$ hard mask 340 is removed, a device separation area (not illustrated) for separating devices is formed. Then, as illustrated in FIG. 16B, the source elec-
trode 132 is formed over the contact area 332, and the drain electrode 133 is formed over the contact area 333. More specifically, photoresist is applied to the cap layer 124, the contact area 332, and the contact area 333 after the forming of the device separation area (not illustrated). Then, the photoresist is exposed and developed. Thereby, a resist pattern (not illustrated) having openings corresponding to areas where the source electrode 132 and the drain electrode 133 are to be formed. Then, a metal film having a layered configuration including Ta/Al is deposited over the resist pattern by using, for example, a vacuum deposition method. Then, by impregnating the resist pattern and the metal film with an organic solvent and performing lift-off, the resist pattern can be removed together with the metal layered film formed over the resist pattern. Thereby, the metal layered film remaining after the removal of the resist pattern becomes the source electrode 132 and the drain electrode 133. Then, the metal layered film is placed in a nitrogen atmosphere and subject to a thermal process at a temperature between 400° C. and 1000° C. (e.g., 550° C.). Thereby, ohmic contact of the source electrode 132 and the drain electrode 133 is achieved.

Figure 17A:
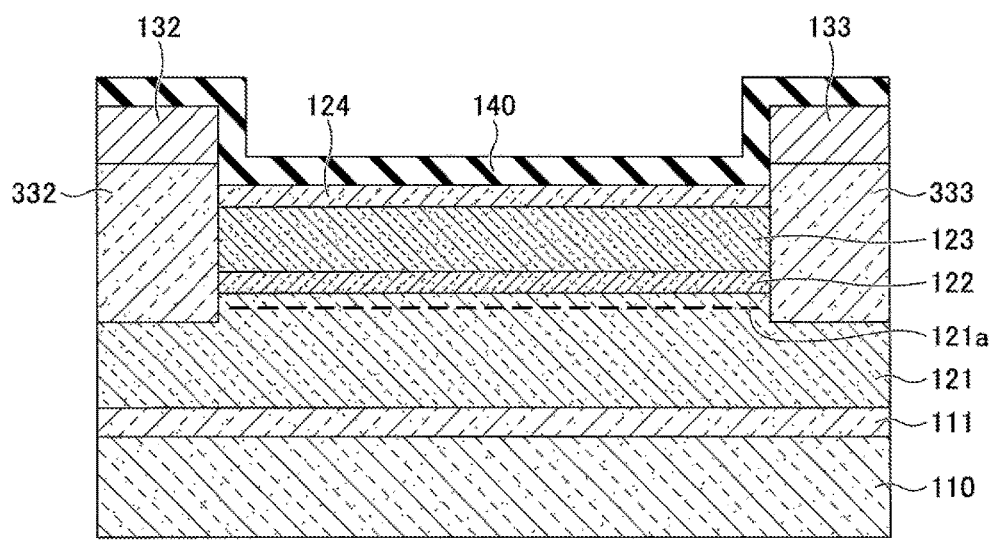
FIGS. 17A and 17B are schematic diagrams illustrating processes of a method for manufacturing a semiconductor device according to the third embodiment of the present invention (part 3)

Then, as illustrated in FIG. 17A, the protection film 140 is formed over the cap layer 124.

Figure 17B:
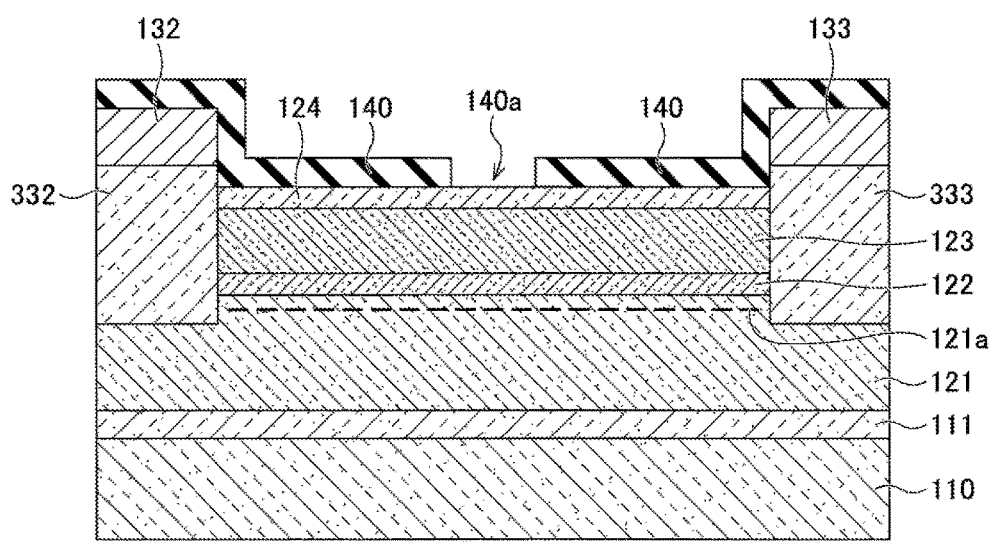

Then, as illustrated in FIG. 17B, an opening 140a is formed in a part of the protection film 140 corresponding to the area where the gate electrode 131 is to be formed. By forming the opening 140a, the cap layer 124 is exposed.

Figure 18:
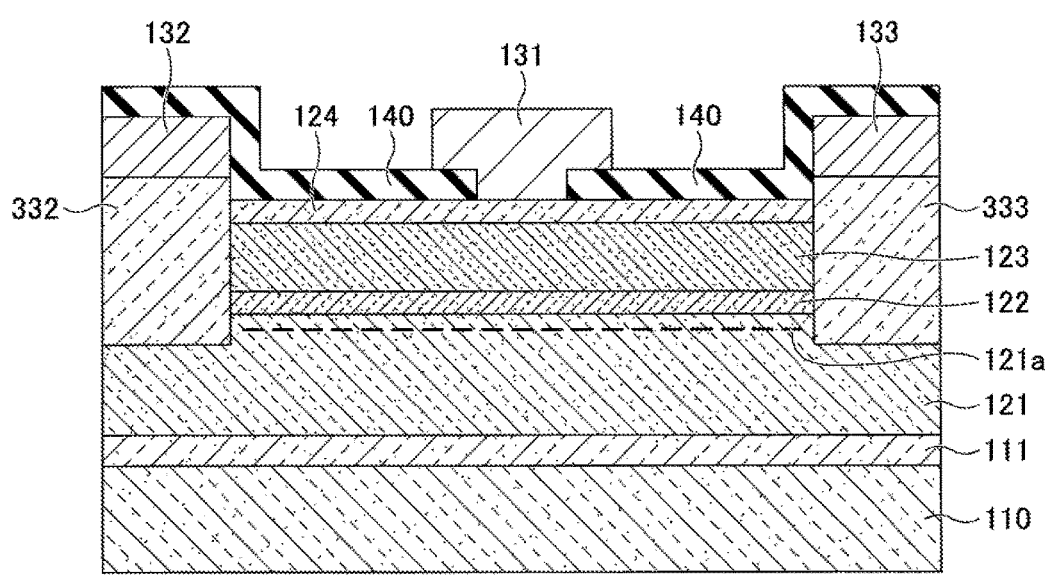
FIG. 18 is a schematic diagram illustrating a process of a method for manufacturing a semiconductor device according to the third embodiment of the present invention (part 4)

Then, as illustrated in FIG. 18, the gate electrode 131 is formed over a part of the cap layer 124 exposed in the opening 140a of the protection film 140.

By performing the above-described processes, the semiconductor device 300 of the third embodiment can be manufactured.

According to the semiconductor device 300 of the third embodiment, the barrier layer 123 is formed by AlGaN. Therefore, the contact areas 443, 333 can be formed by performing a high temperature process of epitaxial growth after forming the barrier layer 123.

Note that the details other than those described in the third embodiment are the same as the details described in the first and second embodiments.

Fourth Embodiment

Next, the fourth embodiment of the present invention is described. In the fourth embodiment, like components are denoted by like reference numerals as of those of the first to third embodiments and are not further explained. The fourth embodiment pertains to a method for manufacturing a semiconductor device in which a semiconductor device 400 having the same configuration as the semiconductor device 300 of the third embodiment is manufactured by a method different from the manufacturing method of the third embodiment. According to the semiconductor device 400 of the fourth embodiment, the contact areas 332, 333 are formed by implanting ions of an n-type impurity element to parts of the cap layer 124, the barrier layer 123, the spacer layer 122, and the channel layer 121 corresponding to areas directly below the source electrode 132 and the drain electrode 133.

The method for manufacturing a semiconductor device of the fourth embodiment is described with reference to FIGS. 19A to 22.

Figure 19A:
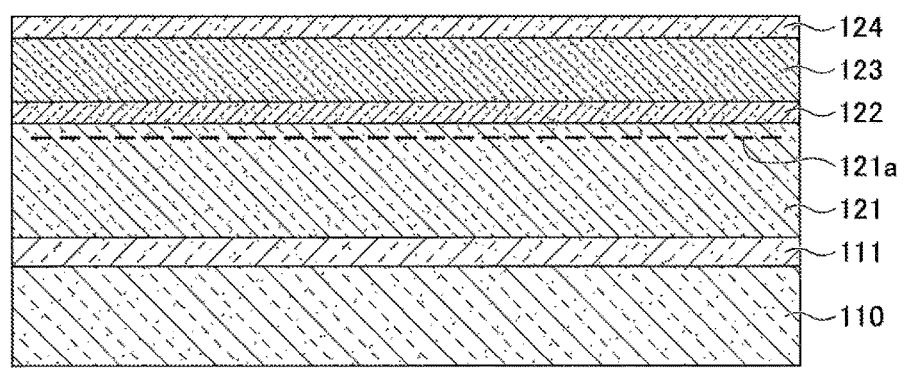
FIGS. 19A and 19B are schematic diagrams illustrating processes of a method for manufacturing a semiconductor device according to a fourth embodiment of the present invention (part 1)

First, as illustrated in FIG. 19A, the buffer layer 111, the channel layer 121, the spacer layer 122, the barrier layer 123, and the cap layer 124 are formed over the substrate 110 by performing epitaxial growth on a nitride semiconductor layer.

Figure 19B:
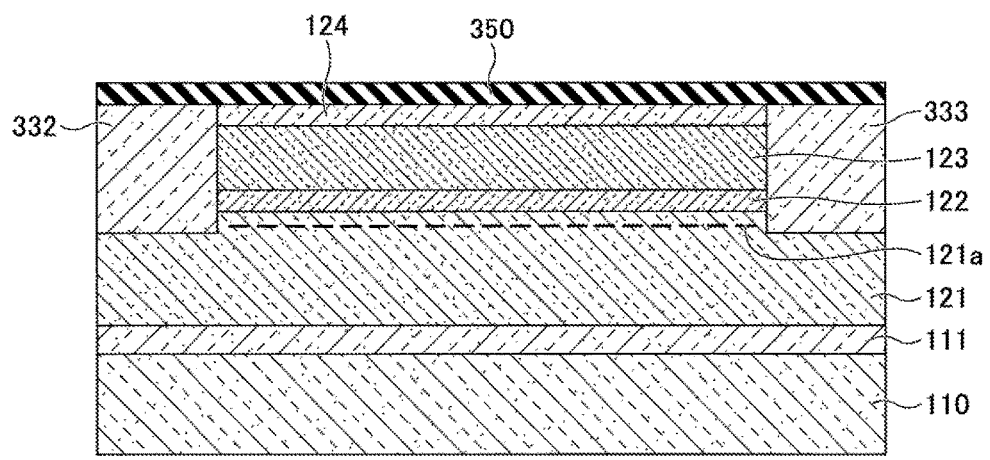

Then, as illustrated in FIG. 19B, parts of the cap layer 124, the barrier layer 123, the spacer layer 122, the channel layer 121 are implanted with ions in areas where the source electrode 132 and the drain electrode 133 are to be formed. Further, a $SiO_2$ film 350 is deposited over the cap layer 124 and subjected to a thermal process. More specifically, photoresist is applied over the cap layer 124. Then, the photoresist is exposed and developed. Thereby, a resist pattern (not illustrated) is formed with openings corresponding to areas where the source electrode 132 and the drain electrode 133 are to be formed. Then, ions of Si serving as n-type impurity elements are implanted to parts of the cap layer 124, the barrier layer 123, the spacer 122, and the channel layer 121 corresponding to areas where the resist pattern is not formed. In performing the ion implantation of the fourth embodiment, the dosage of ions is approximately $1 \times 10^{13}$ $cm^{-3}$, and acceleration voltage is 20 keV. Then, the $SiO_2$ film 350 is deposited by thermal CVD (Chemical Vapor Deposition). By performing the thermal process at a temperature greater than or equal to 1000° C. (e.g., 1100° C.), the implanted Si ions are activated and their crystallinity is recovered. Thereby, the contact areas 332, 333 are formed.

Figure 20A:
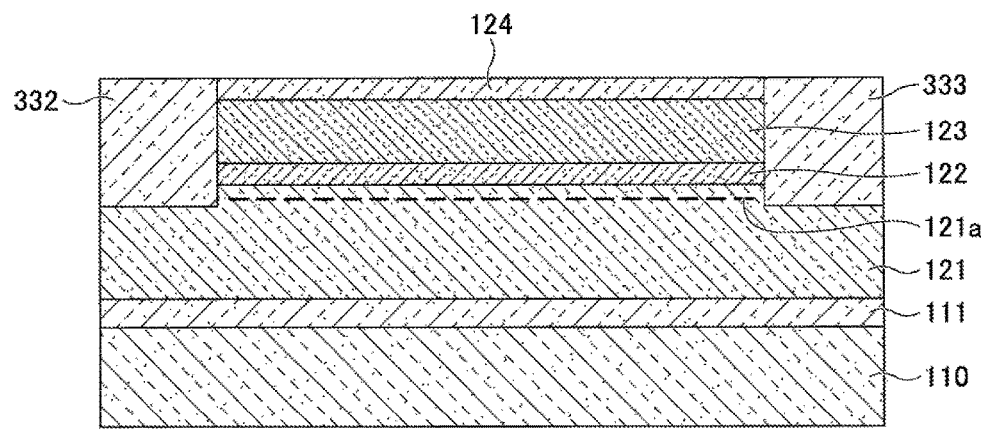
FIGS. 20A and 20B are schematic diagrams illustrating processes of a method for manufacturing a semiconductor device according to the fourth embodiment of the present invention (part 2)

Then, as illustrated in FIG. 20A, the $SiO_2$ film 350 is removed by a wet etching process. Then, although not illustrated in the drawings, a device separation area for separating devices is formed.

Figure 20B:
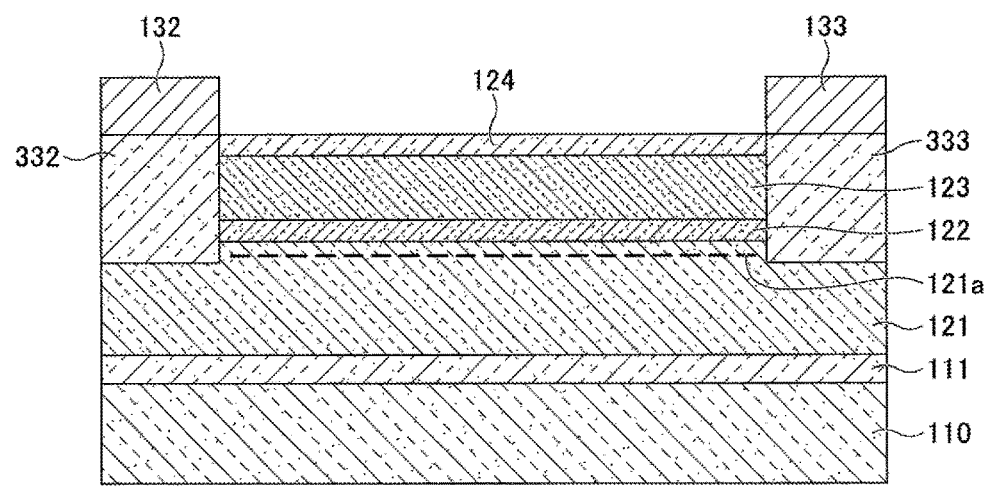

Then, as illustrated in FIG. 20B, the source electrode 132 is formed over the contact area 332, and the drain electrode 133 is formed over the contact area 333.

Figure 21A:
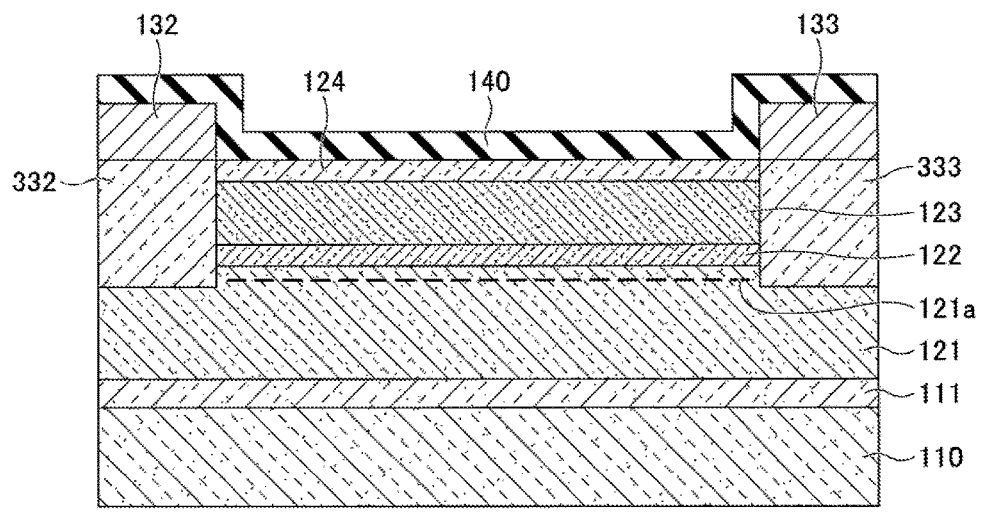
FIGS. 21A and 21B are schematic diagrams illustrating processes of a method for manufacturing a semiconductor device according to the fourth embodiment of the present invention (part 3)

Then, as illustrated in FIG. 21A, the protection film 140 is formed over the cap layer 124.

Figure 21B:
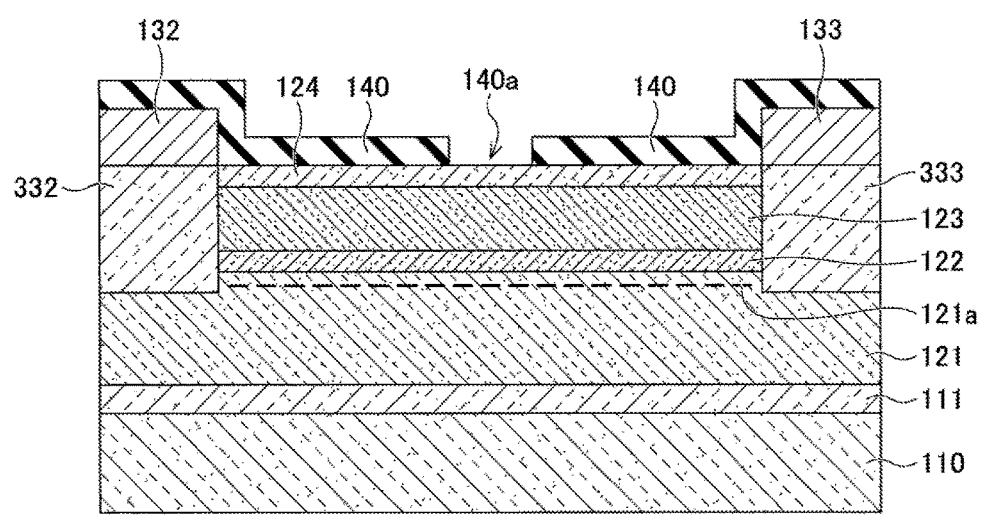

Then, as illustrated in FIG. 21B, the opening 140a is formed in a part of the protection film 140 corresponding to the area where the gate electrode 131 is to be formed. By forming the opening 140a, the cap layer 124 is exposed.

Figure 22:
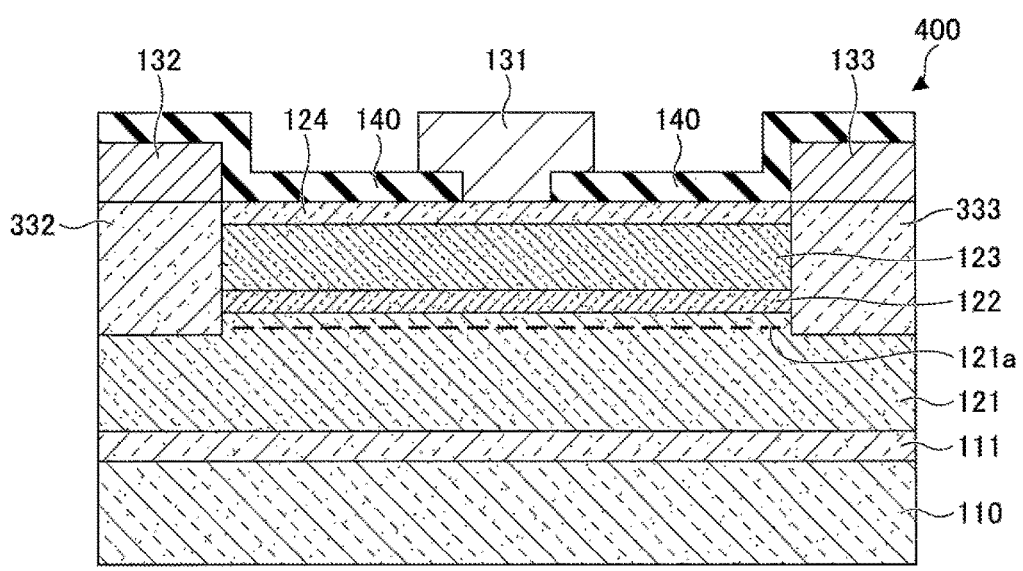
FIG. 22 is a schematic diagram illustrating a process of a method for manufacturing a semiconductor device according to the fourth embodiment of the present invention (part 4)

Then, as illustrated in FIG. 22, the gate electrode 131 is formed over a part of the cap layer 124 exposed in the opening 140a of the protection film 140.

By performing the above-described processes, the semiconductor device 400 of the fourth embodiment can be manufactured.

Note that the details other than those described in the fourth embodiment are the same as the details described in the first to third embodiments.

Fifth Embodiment

Next, the fifth embodiment of the present invention is described. The fifth embodiment pertains to a semiconductor device, an electric power apparatus, and a high frequency amplifier.

Figure 23:
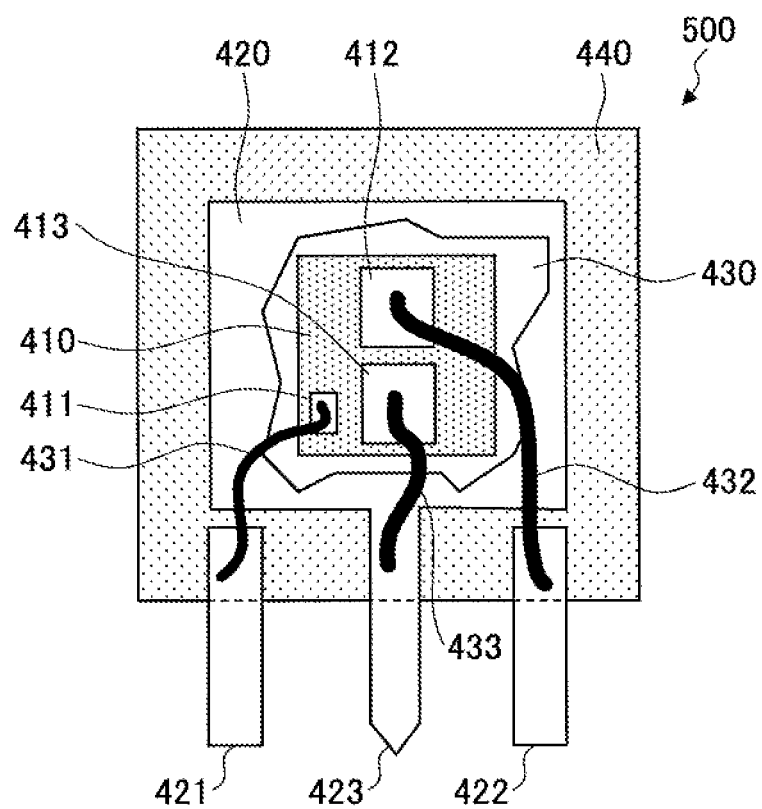
FIG. 23 is a schematic diagram illustrating a discrete-packaged semiconductor device according to a fifth embodiment of the present invention.

The semiconductor device 500 of the fourth embodiment has a configuration in which the semiconductor device of the first to fourth embodiments is discretely packaged. The discretely packaged semiconductor device 500 is described with reference to FIG. 23. FIG. 23 is a schematic diagram illustrating the inside of the discretely packaged semiconductor device 500. For example, the arrangement of the electrodes in the semiconductor device 500 is different from that of the above-described semiconductor device of one of the first to fourth embodiments. The fifth embodiment of the present invention may be described with an example in which a single transistor having the HEMT or UMOS configuration is used in the semiconductor device of one of the first to fourth embodiments.

First, the manufactured semiconductor devices of the first-fourth embodiments are separated from each other by dicing. Thereby, the semiconductor chip 410 including, for example, an HEMT having a GaN type semiconductor material is formed. The semiconductor chip 410 is fixed onto a lead frame 420 by using a die attach agent (e.g., solder) 430. Note that the semiconductor chip 410 is substantially the same as the semiconductor device of one of the above-described first to fourth embodiments.

Then, the gate electrode 411 is connected to a gate lead 421 by way of a bonding wire 431, the source electrode 412 is connected to a source lead 422 by way of a bonding wire 432, and the drain electrode 413 is connected to a drain lead 423 by way of a bonding wire 433. Note that the bonding wires 431, 432, 433 are formed of a metal material such as aluminum (Al). According to the fifth embodiment, the gate electrode 411 is a gate electrode pad that is connected to the gate electrode 131 of one of the semiconductor devices of the first-fourth embodiments. Further, the source electrode 412 is a source electrode pad that is connected to the source electrode 132 of one of the semiconductor devices of the first-fourth embodiments. Further, the drain electrode 413 is a drain electrode pad that is connected to the drain electrode 133 of one of the semiconductor devices of the first-fourth embodiments.

Then, the semiconductor chip 410 along with the other above-described components are molded with a molding resin 440 by using a transfer molding method.

Thereby, a discretely packaged semiconductor device 500 including an HEMT formed with GaN type semiconductor material can be manufactured.

Next, an electric power apparatus and a high frequency amplifier according to an embodiment of the present invention are described. The electric power apparatus and the high frequency amplifier of this embodiment use the semiconductor device described in one of the first to fourth embodiments.

Figure 24:
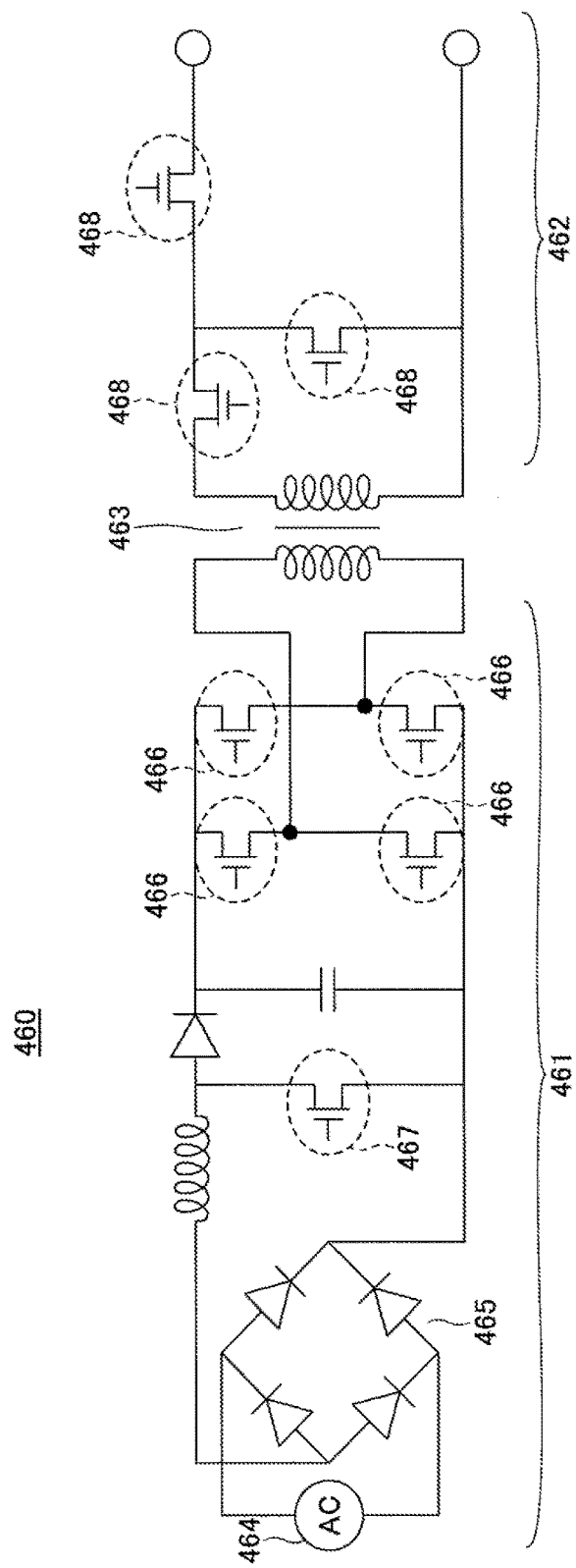
FIG. 24 is a circuit diagram of an electric power apparatus according to the fifth embodiment of the present invention.

First, an electric power apparatus 460 of this embodiment is described with reference to FIG. 24. The electric power apparatus 460 includes a primary circuit 461, a secondary circuit 462, and a trance 463 provided between the primary circuit 461 and the secondary circuit 462. The primary circuit 461 is a high voltage circuit that is provided on a primary side of the electric power apparatus 461 whereas the secondary circuit 462 is a low voltage circuit provided on a secondary side of the electric power apparatus 461. The primary circuit 461 includes, for example, an alternative current power source 464, a so-called bridge rectifier circuit 465, multiple switching devices (four switching devices in the example illustrated in FIG. 24) 466, and one switching device 467. The secondary circuit 462 includes multiple switching devices (three switching devices in the example illustrated in FIG. 24) 468. In the example of FIG. 24, the semiconductor device of one of the above-described first to fourth embodiments is used as the switching device 466 and the switching device 467 of the primary circuit 461. Note that the switching device 466 and the switching device 467 of the primary circuit 461 are preferably semiconductor devices that are normally off (normally-off semiconductor devices). Further, the switching devices 468 used in the secondary circuit 462 use a regular MISFET (metal insulator semiconductor field effect transistor) formed of silicon.

Figure 25:
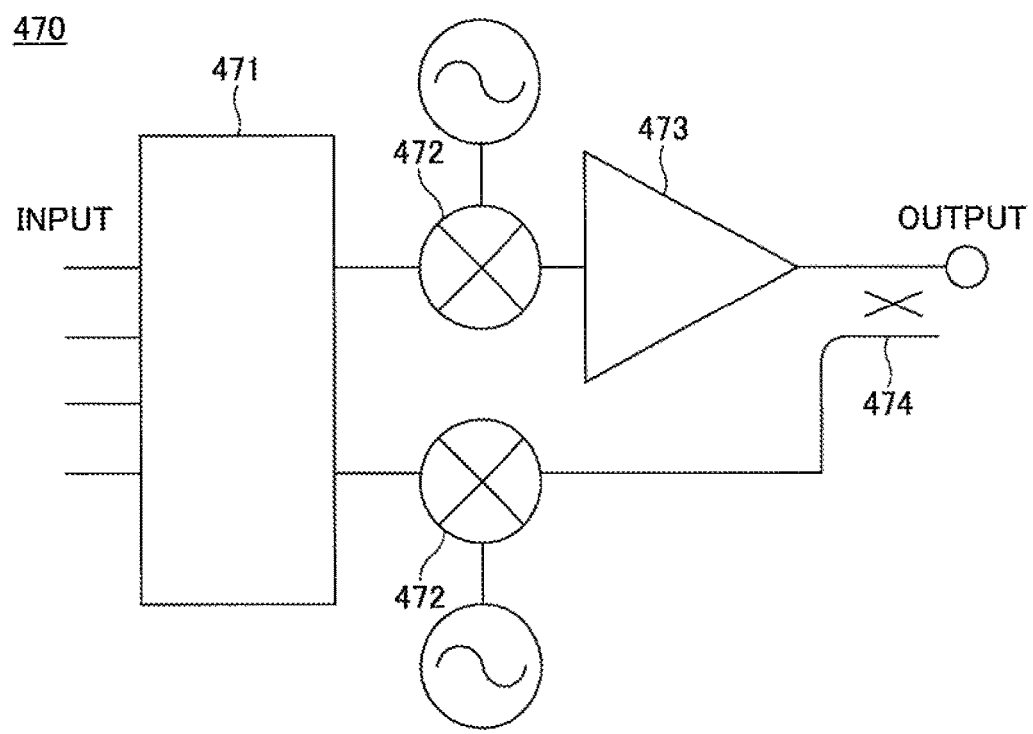
FIG. 25 is a schematic diagram illustrating a configuration of a high frequency amplifier according to the fifth embodiment of the present invention.

Next, a high frequency amplifier 470 of this embodiment is described with reference to FIG. 25. The high frequency amplifier 470 of this embodiment may be applied to, for example, a power amplifier of a base station of a mobile phone. The high frequency amplifier 470 includes a digital pre-strain circuit 471, a mixer 472, a power amplifier 473, and a directional coupler 474. The digital pre-strain circuit 471 compensates non-linear strain of an input signal. The mixer 472 mixes an alternate current signal with the input signal having its non-linear strain compensated by the digital pre-strain circuit 471. The power amplifier 473 amplifies the input signal mixed with the alternate current signal. In the example of FIG. 25, the power amplifier 473 includes the semiconductor device of one of the above-described first to fourth embodiments. The directional coupler 474 performs, for example, monitoring of input signals and output signals. In the circuit illustrated in FIG. 25, output signals of the mixer 472 are mixed with alternate current signals and sent out to the digital pre-strain circuit 471 by the switching of a switch.

According to the semiconductor device of the above-described embodiments, the sheet resistance of an HEMT using AlGaN in its barrier layer can be can reduced and achieve high output.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a substrate;
   a first semiconductor layer formed over the substrate, the first semiconductor layer including a first nitride semiconductor;
   a second semiconductor layer formed over the first semiconductor layer, the second semiconductor including a second nitride semiconductor;
   a third semiconductor layer formed over the second semiconductor layer, the third semiconductor layer including a third nitride semiconductor; and
   a gate electrode, a source electrode, and a drain electrode that are formed over the third semiconductor layer;
   wherein the first nitride semiconductor included in the first semiconductor layer is GaN, the second nitride semiconductor included in the second semiconductor layer and the third nitride semiconductor included in the third semiconductor layer are AlGaN, and the concentration of oxygen included in the third semiconductor layer is higher than the concentration of oxygen included in the second semiconductor layer,
   wherein the concentration of oxygen included in the second semiconductor layer is less than $5.0 \times 10^{18}$ cm$^{-3}$, and
   wherein the concentration of oxygen included in the third semiconductor layer is greater than or equal to $5.0 \times 10^{18}$ cm$^{-3}$.

2. The semiconductor device as claimed in claim 1,
   wherein the first semiconductor layer is formed of a material including GaN, and
   wherein the second semiconductor layer and the third semiconductor layer are formed of a material including AlGaN.

3. The semiconductor device as claimed in claim 1,
   wherein the concentration of oxygen included in the third semiconductor layer is greater than or equal to $1.0 \times 10^{19}$ cm$^{-3}$.

4. The semiconductor device as claimed in claim 1,
   wherein the Al composition of the second semiconductor layer is greater than or equal to 0.3, and
   wherein the Al composition of the third semiconductor layer is greater than or equal to 0.4.

5. The semiconductor device as claimed in claim 1,
   wherein the second semiconductor layer has a film thickness greater than or equal to 0.5 nm and less than or equal to 4.0 nm.

6. The semiconductor device as claimed in claim 1,
   wherein the third semiconductor layer has a film thickness greater than or equal to 4 nm and less than or equal to 20 nm.

7. The semiconductor device as claimed in claim 1, further comprising:
   a fourth semiconductor layer formed over the third semiconductor layer;
   wherein the fourth semiconductor layer is formed of a material including n-GaN, and
   wherein the gate electrode, the source electrode, and the drain electrode are formed over the third semiconductor layer or the fourth semiconductor layer.

8. The semiconductor device as claimed in claim 1,
   wherein contact areas are formed directly below the source electrode and the drain electrode, and
   wherein the contact areas are doped with an n-type impurity element.

9. A semiconductor device comprising:
   a substrate;
   a first semiconductor layer formed over the substrate, the first semiconductor layer including a first nitride semiconductor;
   a second semiconductor layer formed over the first semiconductor layer, the second semiconductor including a second nitride semiconductor;
   a third semiconductor layer formed over the second semiconductor layer, the third semiconductor layer including a third nitride semiconductor; and
   a gate electrode, a source electrode, and a drain electrode that are formed over the third semiconductor layer;
   wherein the first nitride semiconductor included in the first semiconductor layer is GaN,
   wherein a main plane of the first semiconductor layer is a C-plane,
   wherein the second nitride semiconductor included in the second semiconductor layer and the third nitride semiconductor included in the third semiconductor layer are AlGaN, and
   wherein the concentration of oxygen included in the third semiconductor layer is higher than the concentration of oxygen included in the second semiconductor layer.

10. The semiconductor device as claimed in claim 9,
    wherein the concentration of oxygen included in the second semiconductor layer is less than $5.0 \times 10^{18}$ cm$^{-3}$, and
    wherein the concentration of oxygen included in the third semiconductor layer is greater than or equal to $5.0 \times 10^{18}$ cm$^{-3}$.

11. A method for manufacturing a semiconductor device, the method comprising:
    forming a first semiconductor layer above a substrate, the first semiconductor layer including a first nitride semiconductor;

forming a second semiconductor layer above the first semiconductor layer, the second semiconductor including a second nitride semiconductor;

forming a third semiconductor layer above the second semiconductor layer, the third semiconductor layer including a third nitride semiconductor; and forming a gate electrode, a source electrode, and a drain electrode above the third semiconductor layer;

wherein the first nitride semiconductor included in the first semiconductor layer is GaN, the second nitride semiconductor included in the second semiconductor layer and the third nitride semiconductor included in the third semiconductor layer are AlGaN, and the concentration of oxygen included in the third semiconductor layer is higher than the concentration of oxygen included in the second semiconductor layer, wherein the concentration of oxygen included in the second semiconductor layer is less than $5.0 \times 10^{18}$ cm$^{-3}$, and wherein the concentration of oxygen included in the third semiconductor layer is greater than or equal to $5.0 \times 10^{18}$ cm$^{-3}$.

12. The method as claimed in claim 11, wherein the first semiconductor layer, the second semiconductor layer, and the third semiconductor layer are formed by performing MOVPE (Metal Organic Vapor Phase Epitaxy), wherein hydrogen is used as a carrier gas when forming the second semiconductor layer, wherein nitrogen is used as a carrier gas when forming the third semiconductor layer, and wherein the temperature for forming the third semiconductor layer is lower than the temperature for forming the second semiconductor layer.

13. The method as claimed in claim 11, further comprising:

forming a fourth semiconductor layer formed over the third semiconductor layer;

wherein the fourth semiconductor layer is formed of an n-type nitride semiconductor, and wherein the gate electrode, the source electrode, and the drain electrode are formed over the third semiconductor layer or the fourth semiconductor layer.

14. The method as claimed in claim 11, further comprising:

forming an opening by removing a part of each of the first semiconductor layer, the second semiconductor layer, and third semiconductor layer directly below the source electrode and the drain electrode;

forming a contact area by growing an n-type nitride semiconductor in the opening by using MOVPE; and forming the source electrode and the drain electrode above the contact area;

wherein the forming of the opening, the forming of the contact area, and the forming of the source electrode and the drain electrode are performed after the forming of the third semiconductor layer.

15. The method as claimed in claim 11, further comprising:

implanting ions of an n-type impurity element to a part of each of the first semiconductor layer, the second semiconductor layer, and third semiconductor layer directly below the source electrode and the drain electrode;

forming a contact area in the ion-implanted part by thermally processing the ion-implanted part after the implanting of ions; and forming the source electrode and the drain electrode above the contact area;

wherein the implanting of ions, the forming of the contact area, and the forming of the source electrode and the drain electrode are performed after the forming of the third semiconductor layer.

16. The method as claimed in claim 15, wherein the n-type impurity element is Si.

17. An electric power apparatus comprising: the semiconductor device as claimed in claim 1.

18. An amplifier comprising: the semiconductor device as claimed in claim 1.

* * * * *